US011380610B2

(12) United States Patent
Harazono

(10) Patent No.: US 11,380,610 B2
(45) Date of Patent: Jul. 5, 2022

(54) SEMICONDUCTOR DEVICE AND METHOD OF MANUFACTURING SEMICONDUCTOR DEVICE

(71) Applicant: MICRO MODULE TECHNOLOGY CO., LTD., Kanagawa (JP)

(72) Inventor: Fumikazu Harazono, Kanagawa (JP)

(73) Assignee: MICRO MODULE TECHNOLOGY CO., LTD., Kanagawa (JP)

(*) Notice: Subject to any disclaimer, the term of this patent is extended or adjusted under 35 U.S.C. 154(b) by 16 days.

(21) Appl. No.: 17/134,594

(22) Filed: Dec. 28, 2020

(65) Prior Publication Data

US 2021/0125914 A1 Apr. 29, 2021

Related U.S. Application Data

(63) Continuation of application No. PCT/JP2019/027751, filed on Jul. 12, 2019.

(30) Foreign Application Priority Data

Jul. 19, 2018 (JP) .............................. JP2018-136118

(51) Int. Cl.
*H01L 23/367* (2006.01)
*H01L 23/38* (2006.01)
(Continued)

(52) U.S. Cl.
CPC ...... *H01L 23/49844* (2013.01); *H01L 23/367* (2013.01); *H01L 23/38* (2013.01);
(Continued)

(58) Field of Classification Search
CPC . H01L 23/49844; H01L 23/367; H01L 23/38; H01L 23/4924; H01L 25/18; H01L 25/50
See application file for complete search history.

(56) References Cited

U.S. PATENT DOCUMENTS 8,358,014 B2 * 1/2013 Koduri ................... H01L 24/41
257/734
8,450,845 B2 * 5/2013 Ikeda .................. H01L 23/3735
257/E23.101
(Continued)

FOREIGN PATENT DOCUMENTS

JP 5357315 B1 12/2013
WO 2016/067383 A1 5/2016

OTHER PUBLICATIONS

International Search Report issued in PCT/JP2019/027751 dated Oct. 1, 2019 with English Translation (5 pages).

*Primary Examiner* — Peniel M Gumedzoe
(74) *Attorney, Agent, or Firm* — Nakanishi IP Associates, LLC

(57) ABSTRACT

A source terminal and a gate terminal are connected to a wiring pattern of the first substrate. A diode is provided under a second substrate such that an anode is connected to a wiring pattern of the second substrate. A plate-like portion of the first electrode is provided between the switching element and the diode, and a linking section of the first electrode connects the plate-like portion and the wiring pattern of the first substrate. A second electrode being substantially columnar and connecting the wiring pattern of the first substrate and the wiring pattern of the second substrate is provided in an opposite side to the linking section with the switching element interposed. A thickness of the plate-like portion of the first electrode is less than or equal to a thickness of each of the wiring pattern of the first substrate and the wiring pattern of the second substrate.

20 Claims, 20 Drawing Sheets

(51) Int. Cl.
*H01L 25/18* (2006.01)
*H01L 25/00* (2006.01)
*H01L 23/498* (2006.01)
*H01L 23/492* (2006.01)

(52) U.S. Cl.
CPC .......... *H01L 23/4924* (2013.01); *H01L 25/18* (2013.01); *H01L 25/50* (2013.01)

(56) References Cited

U.S. PATENT DOCUMENTS

| | | | |
|---|---|---|---|
| 9,991,184 B2* | 6/2018 | Ikeda | H01L 23/49838 |
| 2009/0302444 A1* | 12/2009 | Ueda | H01L 25/117 438/109 |
| 2014/0264611 A1 | 9/2014 | Lee et al. | |
| 2015/0206864 A1 | 7/2015 | Harazono | |
| 2017/0311482 A1 | 10/2017 | Ikeda et al. | |

* cited by examiner

SEMICONDUCTOR DEVICE AND METHOD OF MANUFACTURING SEMICONDUCTOR DEVICE

CROSS-REFERENCE TO RELATED APPLICATIONS

This application is a continuation application of International Patent Application No. PCT/JP2019/027751 filed on Jul. 12, 2019, which claims priority to Japanese Patent Application No. 2018-136118 filed on Jul. 19, 2018, the entire contents of which are incorporated by reference.

TECHNICAL FIELD

The present invention relates to a semiconductor device and a method of manufacturing a semiconductor device.

BACKGROUND ART

Patent Document 1 discloses a semiconductor device including a FET provided on a substrate, a first electrode provided in an opposite side to the substrate with the FET interposed, a diode provided in an opposite side to the FET with the first electrode interposed, and a second electrode provided in an opposite side to the first electrode with the diode interposed. In the invention described in Patent Document 1, the FET and the diode are vertically arranged, and thus mounting area is reduced, and the semiconductor device is miniaturized.

CITATION LIST

Patent Literature

Patent Document 1: JP 5357315 B

The semiconductor device of the invention described in Patent Document 1 is a power module, and a large current is assumed to flow. When a large current flows through the semiconductor device, the temperature of the substrate, the first electrode and the second electrode increases, and thus, to prevent failure of the semiconductor device due to heat, it is necessary to bring a heat sink into contact with the substrate (e.g. a ceramic substrate) or the second electrode to dissipate heat. However, when a surface of the substrate and a surface of the heat sink are brought into contact, due to a difference in a linear expansion coefficient between ceramics such as aluminum nitride that is a material of the substrate, and copper that is a material of the heat sink, distortion within the semiconductor device increases, and a defect such as poor connection at an interface between the substrate and the heat sink or a crack of the material is easily generated.

In addition, in the invention described in Patent Document 1, due to a large difference in a linear expansion coefficient between copper that is a material of the first electrode and silicon carbide that is a material of the FET and the diode, a defect such as poor connection at an interface between the first electrode and the FET or a crack of solder joining the first electrode and the FET is easily generated. Due to such a defect, the reliability of the semiconductor device (an operation property of the semiconductor device without failure during a period of use) may decrease.

SUMMARY OF INVENTION

One or more embodiments of the present invention provide a semiconductor device miniaturized and having high reliability, and to provide a method of manufacturing a semiconductor device.

A semiconductor device according to one or more embodiments of the present invention includes, for example, a first substrate being substantially plate-shaped, the first substrate including a first surface provided with a first wiring pattern, a second wiring pattern, and a third wiring pattern, and including a second surface being opposite to the first surface and provided with a fourth wiring pattern that is a heat dissipation member; a second substrate being substantially plate-shaped, the second substrate including a third surface provided with a fifth wiring pattern, and including a fourth surface being opposite to the third surface and provided with a sixth wiring pattern that is a heat dissipation member, the third surface being provided in an upper side of the first substrate and facing the first surface; a switching element being substantially plate-shaped and provided on the first substrate, the switching element including one surface provided with a source terminal and a gate terminal, and including the other surface provided with a drain terminal, the source terminal being connected to the first wiring pattern and the gate terminal being connected to the second wiring pattern; an electronic component being substantially plate-shaped and provided under the second substrate, the electronic component including one surface provided with a first terminal and including the other surface provided with a second terminal, the first terminal being connected to the fifth wiring pattern; a first electrode including a plate-like (plate-shaped) portion being substantially plate-shaped and provided between the switching element and the electronic component, and including a linking section connecting the plate-shaped portion and the third wiring pattern, the drain terminal being connected to a fifth surface of the plate-shaped portion, and the second terminal being connected to a sixth surface opposite to the fifth surface of the plate-shaped portion; and a second electrode being substantially columnar and provided between the first substrate and the second substrate and connecting the first wiring pattern and the fifth wiring pattern, the second electrode being provided in an opposite side to the linking section with the switching element interposed, wherein a thickness of the plate-shaped portion is less than or equal to a thickness of each of the first wiring pattern, the second wiring pattern, the third wiring pattern, the fourth wiring pattern, the fifth wiring pattern, and the sixth wiring pattern.

According to the semiconductor device of one or more embodiments of the present invention, the switching element is provided on the first substrate such that the source terminal and the gate terminal are connected to the wiring pattern of the first substrate. A diode is provided under the second substrate such that an anode is connected to the wiring pattern of the second substrate. The plate-shaped portion of the first electrode is provided between the switching element and the diode, and the linking section of the first electrode connects the plate-shaped portion and the wiring pattern of the first substrate. The second electrode being substantially columnar and connecting the wiring pattern of the first substrate and the wiring pattern of the second substrate is provided in an opposite side to the linking section with the switching element interposed. Accordingly, the semiconductor device can be miniaturized. Then, the semiconductor device is miniaturized, and thus internal strain due to heat can be reduced. In addition, the thickness of the plate-shaped portion of the first electrode is less than or equal to the thickness of each of the wiring pattern of the first substrate and the wiring pattern of the second substrate.

Accordingly, heat is dissipated via the electrode and deformation of the plate-shaped portion can also be prevented. In addition, since the wiring pattern is used as the heat dissipation member, the heat dissipation member can be prevented from peeling from the substrate due to a difference in a linear expansion coefficient. As a result, the reliability of the semiconductor device can be enhanced. Further, since other components are interposed between the first substrate and the second substrate including the wiring patterns that are heat dissipation members and are integrated, the number of components is reduced and productivity can be enhanced.

Here, each of the source terminal and the gate terminal may be provided with a plurality of protrusions, each of the plurality of protrusions may be formed such that a center portion is higher than other portions, tips of the plurality of protrusions may abut on the first wiring pattern or the second wiring pattern, and the source terminal and the first wiring pattern, and the gate terminal and the second wiring pattern may be joined by a conductive material being paste and solidifying by sintering. Accordingly, the gate terminal and the source terminal can be prevented from being damaged due to a load applied to the gate terminal and the source terminal during manufacturing of the semiconductor device. In addition, since an interval between the wiring pattern of the first substrate and the switching element is kept constant, the conductive material does not flow out to an unnecessary location, and a short circuit is prevented.

Here, the plate-shaped portion may be formed of molybdenum, tungsten, or 42 alloy. Accordingly, non-linear strain of the drain terminal can be reduced.

Here, the first substrate may have a substantially L shape in a side view, the plate-shaped portion may be larger than the electronic component in a plan view, the third surface may be provided with an eighth wiring pattern not electrically connected to the fifth wiring pattern, and a third electrode being columnar and connecting the plate-shaped portion and the eighth wiring pattern may be provided between the plate-shaped portion and the second substrate.

Accordingly, heat generated by the switching element or the diode is transferred to both the first substrate and the second substrate, and heat can be dissipated more efficiently.

Here, the first substrate may have a substantially L shape in a side view, the plate-shaped portion may be larger than the electronic component in a plan view, and a Peltier element may be provided between the plate-shaped portion and the second substrate. Accordingly, heat can be dissipated forcibly by using the Peltier element.

Here, the first electrode may be ribbon wire being flexible and wide, and a thickness of the first electrode may be not less than half a first thickness that is a thickness of each of the first wiring pattern, the second wiring pattern, the third wiring pattern, the fourth wiring pattern, the fifth wiring pattern, and the sixth wiring pattern, and not greater than the first thickness. Accordingly, the first electrode is easily bent, and the semiconductor device is easily manufactured. In addition, since the first electrode is thin, a general material can be used for the first electrode.

Here, the second surface may be provided with a seventh wiring pattern, and a via connecting the second wiring pattern and the seventh wiring pattern may be formed in the first substrate. Accordingly, when the semiconductor device is installed in another device, a degree of freedom of placement of the semiconductor device increases, and a degree of freedom of the device in which the semiconductor device is installed can be enhanced.

Here, an outer lead may be connected to the first wiring pattern, and the second electrode may be integrated with the outer lead. Accordingly, the number of components is reduced, and manufacturing can be performed easily.

Here, the electronic component may be a diode, the first terminal may be an anode, and the second terminal may be a cathode. In addition, the electronic component may be a switching element, the first terminal may be a drain terminal, and the second terminal may be a source terminal.

A method of manufacturing a semiconductor device according to one or more embodiments of the present invention includes, for example, the steps of: placing a first substrate with a second surface facing up, the first substrate being substantially plate-shaped, and including a first surface provided with a first wiring pattern, a second wiring pattern, and a third wiring pattern, and including the second surface being opposite to the first surface and provided with a fourth wiring pattern that is a heat dissipation member; applying a conductive material to the first wiring pattern, the second wiring pattern and the third wiring pattern; mounting a switching element on the first substrate such that a source terminal overlaps the first wiring pattern and a gate terminal overlaps the second wiring pattern, the switching element being substantially plate-shaped, and including one surface provided with the source terminal and the gate terminal and including the other surface provided with a drain terminal; applying a conductive material on the drain terminal; mounting on the switching element and the first substrate a first electrode including a plate-shaped portion being substantially plate-shaped and a linking section such that the plate-shaped portion overlaps the drain terminal and the linking section overlaps the third wiring pattern; mounting a second electrode being substantially columnar on the first substrate such that the second electrode overlaps the first wiring pattern, and forming a first assembly; placing a second substrate with a third surface facing up, the second substrate being substantially plate-shaped, and including the third surface provided with a fifth wiring pattern and including a fourth surface being opposite to the third surface and provided with a sixth wiring pattern that is a heat dissipation member; applying a conductive material to the fifth wiring pattern; mounting an electronic component on the second substrate such that a first terminal overlaps the fifth wiring pattern, and forming a second assembly, the electronic component being substantially plate-shaped, and including one surface provided with the first terminal and including the other surface provided with a second terminal; applying a conductive material to the plate-shaped portion of the first assembly; and mounting the second assembly on the first assembly such that the second terminal overlaps the plate-shaped portion and the fifth wiring pattern overlaps the second electrode. According to one or more embodiments of the present invention, the thickness of the conductive material becomes uniform, and when all the components are stacked, inclination of the second substrate with respect to the first substrate or variation in the distance between the first substrate and the second substrate is suppressed, and quality is stabilized.

According to one or more embodiments of the present invention, a semiconductor device miniaturized and having high reliability can be provided.

DESCRIPTION OF EMBODIMENTS

Hereinafter, embodiments of the present invention will be described in detail with reference to the drawings. A semiconductor device of the present invention is a power module that controls, converts, and supplies electric power.

First Embodiment

Figure 1:
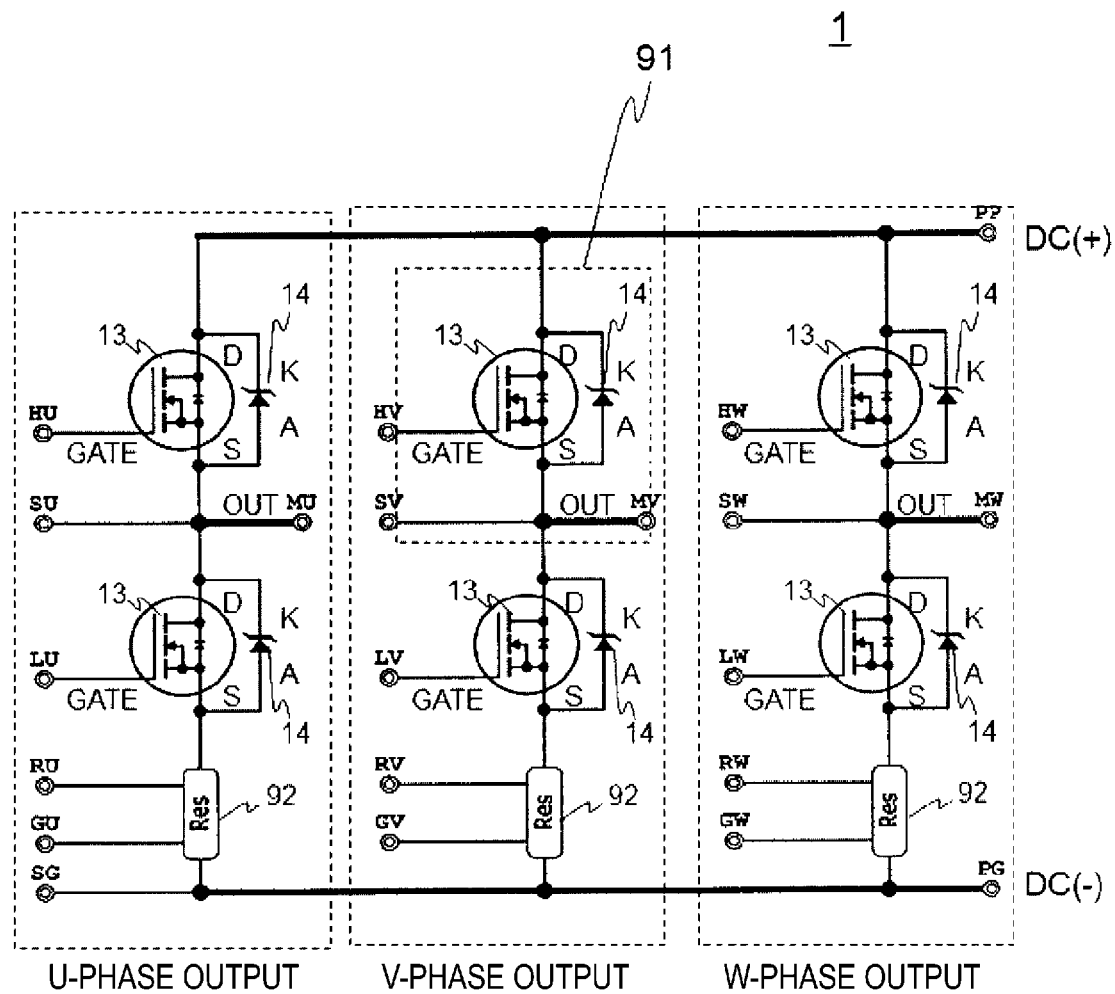
FIG. 1 is a circuit diagram illustrating an example of a circuit configuration of a semiconductor device 1.

FIG. 1 is a circuit diagram illustrating an example of a circuit configuration of a semiconductor device 1. The circuit is a power conversion circuit including a three-phase pulse width modulation (PWM) inverter, and includes a U-phase output, a V-phase output, and a W-phase output between high-voltage direct current power source lines DC (+) and DC (−).

The U-phase output, the V-phase output, and the W-phase output each include two units 91, and in each of the two units 91, a switching element 13 (described in detail below) and a diode 14 (described in detail below) are connected in parallel. In the unit 91, a drain (D) of the switching element 13 is connected to a cathode (K) of the diode 14, and a source (S) of the switching element 13 is connected to an anode (A) of the diode 14. A gate (GATE) of the switching element is controlled by a control circuit (not illustrated).

Output lines (OUT) of the U-phase output, the V-phase output, and the W-phase output are connected to a U-phase coil, a V-phase coil, and a W-phase coil of a three-phase motor, respectively. Since the U-phase output, the V-phase output, and the W-phase output each include the two units 91, the three-phase motor can be driven by using six units 91.

The U-phase output, the V-phase output, and the W-phase output each include a shunt resistor 92 for temperature measurement and current measurement. However, the shunt resistor 92 is not essential.

Figure 2:
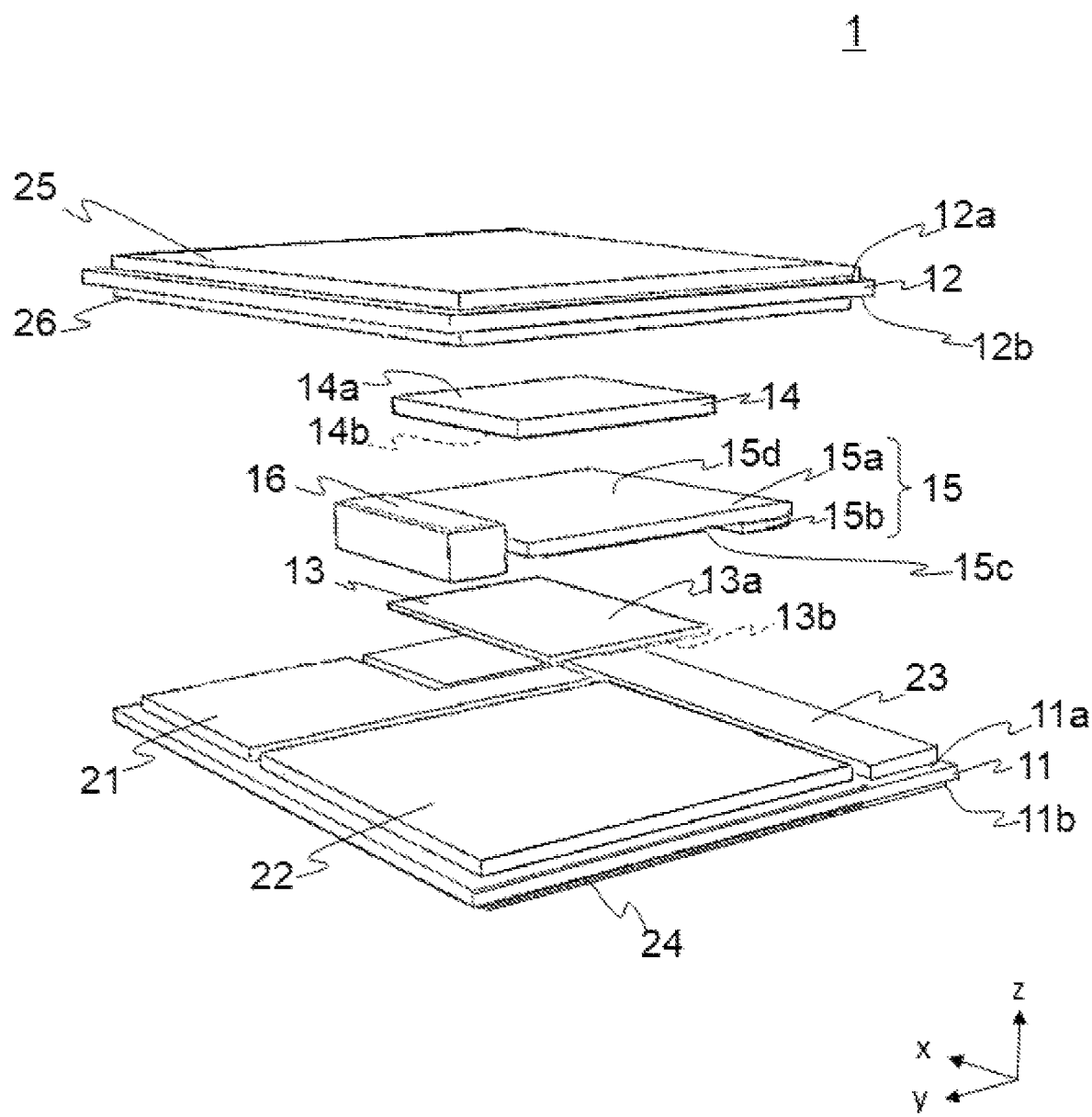
FIG. 2 is an exploded perspective view schematically illustrating the semiconductor device 1 according to an embodiment of the present invention.
Figure 3:
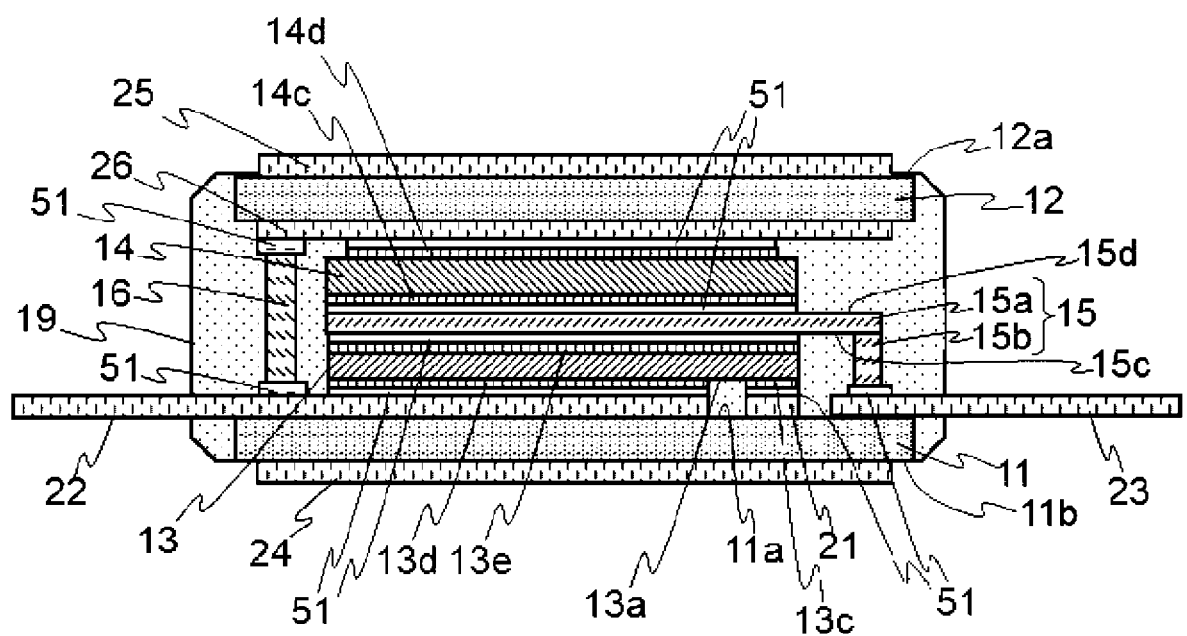
FIG. 3 is a cross-sectional view schematically illustrating the semiconductor device 1.

FIG. 2 is an exploded perspective view schematically illustrating the semiconductor device 1 according to an embodiment of the present invention. FIG. 3 is a cross-sectional view schematically illustrating the semiconductor device 1. The semiconductor device 1 includes one unit 91 (1 in 1). The semiconductor device 1 mainly includes substrates 11 and 12, the switching element 13, the diode 14, and electrodes 15 and 16.

The substrates 11 and 12 are, for example, ceramic substrates, and are formed by using aluminum nitride (AlN) or silicon nitride (SIN) having a property of excellent heat dissipation (high thermal conductivity). In particular, a silicon nitride substrate (SIN) has an excellent mechanical property, and thus is preferable.

The substrates 11 and 12 are substantially plate-shaped, and wiring patterns are formed in both surfaces of the substrates 11 and 12 by using, for example, copper (Cu) or the like. Wiring patterns 21, 22, and 23 are formed in a top surface 11a of the substrate 11, and a wiring pattern 24 is formed in a bottom surface 11b of the substrate 11. A gate terminal 13c (see FIG. 3) of the switching element 13 is electrically connected to the wiring pattern 21, a source terminal 13d (see FIG. 3) of the switching element 13 is electrically connected to the wiring pattern 22, and the electrode 15 is electrically connected to the wiring pattern 23. A thickness of each of the wiring patterns 21, 22, 23 and 24 is approximately 300 μm to approximately 500 μm.

Note that the wiring patterns 21, 22, and 23 actually extend to the outside of the substrate 11, but in FIG. 2, a portion protruding to the outside of the substrate 11 is not illustrated.

A wiring pattern 25 is formed in a top surface 12a of the substrate 12, and a wiring pattern 26 is formed in a bottom surface 12b of the substrate 12. The cathode of the diode 14 is electrically connected to the wiring pattern 26. A thickness of each of the wiring patterns 25 and 26 is approximately 300 μm to approximately 500 μm.

The substrate 12 is provided in an upper side of the substrate 11. The substrates 11 and 12 are provided such that the top surface 11a and the bottom surface 12b face each other. The switching element 13, the diode 14, and the electrodes 15 and 16 are provided between the substrate 11 and the substrate 12.

The wiring pattern 24 is a heat dissipation member formed in the bottom surface 11b, and the wiring pattern 25 is a heat dissipation member formed in the top surface 12a. In the present embodiment, the wiring patterns 24 and 25 are formed in substantially all the bottom surface 11b and the top surface 12a. However, the wiring patterns 24 and 25 need not cover all the bottom surface 11b and the top surface 12a, and the wiring patterns may not be formed in a portion of the bottom surface 11b and the top surface 12a. For example, although in the top surface 11a, there are portions where the wiring patterns 21, 22, and 23 are not formed, it can be said that the wiring patterns 21, 22, and 23 are formed in substantially all the top surface 11a. In addition, the case where the wiring patterns 24 and 25 are formed in substantially all the bottom surface 11b and the top surface 12a also includes the case where a large number of holes, grooves, notches, or the like are formed in the wiring patterns 24 and 25. Further, it is desirable to form the wiring patterns 24 and 25 such that residual copper rates of the top surface 11a and the bottom surface 11b coincide with each other, and residual copper rates of the top surface 12a and the bottom surface 12b coincide with each other.

In the present embodiment, the semiconductor device 1 includes the two substrates 11 and 12 provided with different wiring patterns. However, the semiconductor device may include two identical substrates. For example, two substrates each including the wiring pattern 26 formed in a bottom surface and including the wiring patterns 21, 22, and 23 formed in a top surface may be used, and the two substrates may be provided such that the top surface of the substrate of the lower side and the bottom surface of the substrate of the upper side face each other, and the switching element 13, the diode 14, and the electrode 15 and 16 may be provided between the two substrates. In this case, the wiring pattern 26 is a heat dissipation member as for the substrate of the lower side, and the wiring patterns 21, 22 and 23 are heat dissipation members as for the substrate of the upper side.

The switching element 13 is, for example, a field effect transistor (FET), and a MOSFET is used here. Silicon carbide (SiC) is preferably used as a material of the switching element 13. The switching element 13 is formed, for example, being plate-shaped, and as illustrated in FIG. 3, the gate terminal 13c and the source terminal 13d are provided in one surface 13a, and a drain terminal 13e is provided in the other surface 13b. The gate terminal 13c, the source terminal 13d, and the drain terminal 13e are preferably formed of aluminum.

The diode 14 is, for example, a Schottky barrier diode (SBD), and is formed being substantially plate-shaped. A cathode 14c is provided in one surface 14a of the diode 14, and an anode 14d is provided in the other surface 14b. Silicon carbide (SiC) is preferably used as a material of the diode 14. The cathode 14c and the anode 14d are preferably formed of aluminum.

The electrode 15 includes a plate-like (plate-shaped) portion 15a being substantially plate-shaped and provided between the switching element 13 and the diode 14, and a linking section 15b connecting the plate-like portion 15a and the wiring pattern 23. The linking section 15b is substantially plate-shaped or substantially columnar, and the electrode 15 has a substantially L shape in a side view. Note that in FIG. 2, the electrode 15 is illustrated being rotated by approximately 90 degrees for description.

A drain terminal 13e is electrically connected to one surface 15c of the plate-like portion 15a, and the cathode 14c is electrically connected to a surface 15d opposite to the surface 15c of the plate-like portion 15a.

The thickness of the plate-like portion 15a is substantially the same as the thickness of each of the wiring patterns 21, 22, 23, 24, 25, and 26, and is as thin as 300 μm to 500 μm. A material having high thermal conductivity is used for the electrode 15 and the thickness of the plate-like portion 15a is reduced, and thus deformation of the plate-like portion 15a can be prevented while heat is dissipated via the electrode 15.

The electrode 15 is formed by using a material having high thermal conductivity and a linear expansion coefficient close to a linear expansion coefficient of silicon carbide. Table 1 shows thermal conductivity and a linear expansion coefficient of each material.

TABLE 1

| | Material | | | | | | |
|---|---|---|---|---|---|---|---|
| | Copper (Cu) | Molybdenum (Mo) | Tungsten (W) | 42 Alloy (42 Alloy) | Silicon carbide (SiC) | Aluminum nitride (AlN) | Silicon nitride (SIN) |
| Thermal conductivity (W/mm* K) | 3.95 E−01 | 138 E−3 | 173 E−3 | 15 E−3 45 E−3 | 490 E−3 | 190 E−3 | 90 E−3 |
| Linear expansion coefficient (cm/cm/° C.* 10 7) | 16.5 to 17.7 | 4.9 | 4.3 | 4.0 to 4.7 | 3.7 | 4.6 | 2.8 |

Table 2 shows simulation results of relationship among temperature and a current value of the switching element 13 and a maximum value of non-linear strain at each terminal of the switching element 13 when the semiconductor device 1 is energized while changing the material of the electrode 15. The material of the substrates 11 and 12 is aluminum nitride (AlN). In addition, two types of 42 alloys having different thermal conductivity have been examined.

TABLE 2

| | | Material of electrode 15 | | | |
|---|---|---|---|---|---|
| | | Copper (Cu) | Molybdenum (Mo) | Tungsten (W) | 42 Alloy (42 Alloy) (15 W/m*K) | 42 Alloy (42 Alloy) (45 W/m*K) |
| Maximum temperature (° C.) | | 250.7 | 249.5 | 249.1 | 249.7 | 252.9 |
| Current value (A) | | 100.5 | 98 | 99 | 91 | 95.5 |
| Maximum value of non-linear strain | Gate terminal | 3.1 E−03 | 4.60 E−03 | 6.3 E−03 | 3.9 E−03 | 4.3 E−03 |
| | Source terminal | 14.4 E−03 | 11.9 E−03 | 16.3 E−03 | 13.6 E−03 | 15.0 E−03 |
| | Drain terminal | 27.8 E−03 | 6.7 E−03 | 7.8 E−03 | 5.9 E−03 | 6.9 E−03 |

The drain terminal 13e is a terminal in a side that abuts on the electrode 15. As for a magnitude of non-linear strain of the gate terminal 13c and the source terminal 13d that abut on the substrate 11, no difference according to the electrode 15 is observed. However, as for a magnitude of non-linear strain of the drain terminal 13e that abuts on the electrode 15, a difference is observed according to the material of the electrode 15.

A linear expansion coefficient of each of molybdenum, tungsten, and 42 alloy is close to a linear expansion coefficient of silicon carbide (material of the switching element 13 and the diode 14) (see Table 1). Then, in a case where molybdenum, tungsten, or 42 alloy having a small linear expansion coefficient is used for the electrode 15, non-linear strain of the drain terminal 13e is significantly reduced even at high temperature of approximately 250° C., as compared with the case where copper having a large linear expansion coefficient is used for the electrode 15 (see Table 2).

Thus, non-linear strain of the drain terminal 13e can be reduced even at high temperature of 200° C. or greater by forming the electrode 15 by using molybdenum, tungsten, or 42 alloy. Among these, 42 alloy is the most excellent in terms of a cost.

The electrode 16 is a substantially columnar (here, a substantially prism shape of a substantially rectangular shape in a plan view (as viewed from the +z direction) member provided between the substrate 11 and the substrate 12, and electrically connects the wiring pattern 22 and the wiring pattern 26. The electrode 16 is desirably formed by using molybdenum, tungsten, 42 alloy and the like, but copper may also be used.

The electrode 16 is provided in an opposite side to the linking section 15b with the switching element 13 interposed. The semiconductor device 1 is miniaturized by providing the electrode 16 and the linking section 15b near the switching element 13. In particular, it is desirable to provide the electrode 16 and the linking section 15b adjacent to the switching element 13.

As illustrated in FIG. 3, portions other than the wiring pattern 24 of the substrate 11, portions other than the wiring pattern 25 of the substrate 12, the switching element 13, the diode 14, and the electrodes 15 and 16 are covered with a sealing resin 19. In addition, the wiring patterns 21, 22, and 23 extend to the outside of the substrate 11, and are partially exposed to the outside of the sealing resin 19.

In the switching element 13, the gate terminal 13c and the source terminal 13d face to the lower side, and the drain terminal 13e faces to the upper side. In the diode 14, the cathode 14c faces to the lower side and the anode 14d faces to the upper side.

The gate terminal 13c is connected to the wiring pattern 21, and the source terminal 13d is connected to the wiring pattern 22. The gate terminal 13c and the wiring pattern 21, and the source terminal 13d and the wiring pattern 22 are joined and electrically connected to each other by a conductive material 51 being paste and solidifying by sintering. In addition, the drain terminal 13e and the plate-like portion 15a, the plate-like portion 15a and the cathode 14c, and the anode 14d and the wiring pattern 26 are joined and electrically connected by the conductive material 51. Metal nanopaste (for example, silver nanopaste) or solder paste can be used for the conductive material 51.

In the semiconductor device 1, the gate terminal 13c is disposed downward. In a case where the gate terminal 13c is disposed upward, the diode 14 needs to be disposed away from the gate terminal 13c and displaced with respect to the switching element 13, and the size of the semiconductor device increases. In contrast, in the semiconductor device 1, since the gate terminal 13c faces downward, the diode 14 need not be displaced with respect to the switching element 13, and the semiconductor device 1 can be miniaturized.

Next, a method of manufacturing the semiconductor device 1 will be described.

Manufacturing Method 1

First, the substrate 11 is placed such that the top surface 11a faces upward, and the conductive material 51 is applied on the wiring patterns 21, 22, and 23. Next, the switching element 13 is mounted on the substrate 11 such that the gate terminal 13c overlaps the wiring pattern 21 and the source terminal 13d overlaps the wiring pattern 22.

Next, the conductive material 51 is applied on the drain terminal 13e, and the electrode 15 is mounted on the switching element 13 and the substrate 11 such that the plate-like portion 15a overlaps the drain terminal 13e and the linking section 15b overlaps the wiring pattern 23. In addition, the electrode 16 is mounted on the wiring pattern 22. Note that the step of mounting the electrodes 15 and 16 is a single step. The electrode 15 may be mounted first, the electrode 16 may be mounted first, or the electrodes 15 and 16 may be mounted simultaneously.

Next, the conductive material 51 is applied to the surface 15d of the plate-like portion 15a, and the diode 14 is mounted on the plate-like portion 15a such that the cathode 14c overlaps the surface 15d. Then, the conductive material 51 is applied to the anode 14d and the electrode 16, and the substrate 12 is mounted on the diode 14 and the electrode 16 such that the anode 14d and the electrode 16 overlap the wiring pattern 26.

Subsequently, the conductive material is solidified by sintering to integrate the substrates 11 and 12, the switching element 13, the diode 14, and the electrodes 15 and 16. Finally, portions other than the wiring pattern 24 of the substrate 11, portions other than the wiring pattern 25 of the substrate 12, the switching element 13, the diode 14, and the electrodes 15 and 16 are covered with the sealing resin 19, and the sealing resin 19 is solidified by light, heat or the like to manufacture the semiconductor device 1.

Manufacturing Method 2

Until the switching element 13 and the electrodes 15 and 16 are mounted on the substrate 11, a manufacturing method 2 is the same as the manufacturing method 1 (description will be omitted). What is formed in this way is referred to as a first assembly. In addition to the first assembly, the substrate 12 is placed such that the bottom surface 12b faces up, and the conductive material 51 is applied to the wiring pattern 26. Then, the diode 14 is mounted on the substrate 12 such that the anode 14d overlaps the wiring pattern 26, and a second assembly is formed.

The conductive material 51 is applied to the surface 15d of the plate-like portion 15a, and the second assembly is mounted on the electrodes 15 and 16 of the first assembly such that the cathode 14c overlaps the surface 15d and the electrode 16 overlaps the wiring pattern 26. The subsequent steps of solidifying the conductive material and covering with the sealing resin 19 are the same as the steps in the manufacturing method 1. Since the semiconductor device 1 includes the two substrates 11 and 12, a manufacturing method of forming two assemblies and superimposing the two assemblies can be used as in the manufacturing method 2. In the manufacturing method 2, since it is unnecessary to stack all the components on the substrate 11, manufacturing is performed easily. In addition, in the manufacturing method 2, since the two assemblies are formed by using the substrates 11 and 12 as bases, respectively, application of the conductive material 51 (in particular, application of the conductive material 51 to the substrates 11 and 12) can be performed by printing. As a result, the thickness of the conductive material 51 becomes uniform, and when all the components are stacked, inclination of the substrate 12 with respect to the substrate 11 or variation in the distance between the substrate 11 and the substrate 12 are suppressed, and quality is stabilized.

According to the present embodiment, the gate terminal 13c is disposed downward, and thus the diode 14 need not be displaced with respect to the switching element 13 when the switching element 13 and the diode 14 are disposed overlapping each other, and the semiconductor device 1 can be miniaturized. The semiconductor device 1 is miniaturized, and thus strain due to heat can be reduced. In addition, the thickness of the plate-like portion 15a is reduced to be approximately 300 μm to approximately 500 μm that is the thickness of each of the wiring patterns 21, 22, 23, 24, 25, and 26, and thus heat can be dissipated via the electrode 15. As a result, failure due to high temperature can be prevented and reliability can be enhanced. Reliability in the present invention refers to a property of a semiconductor device that can perform a required function for a predetermined period under predetermined use conditions.

Figure 20:
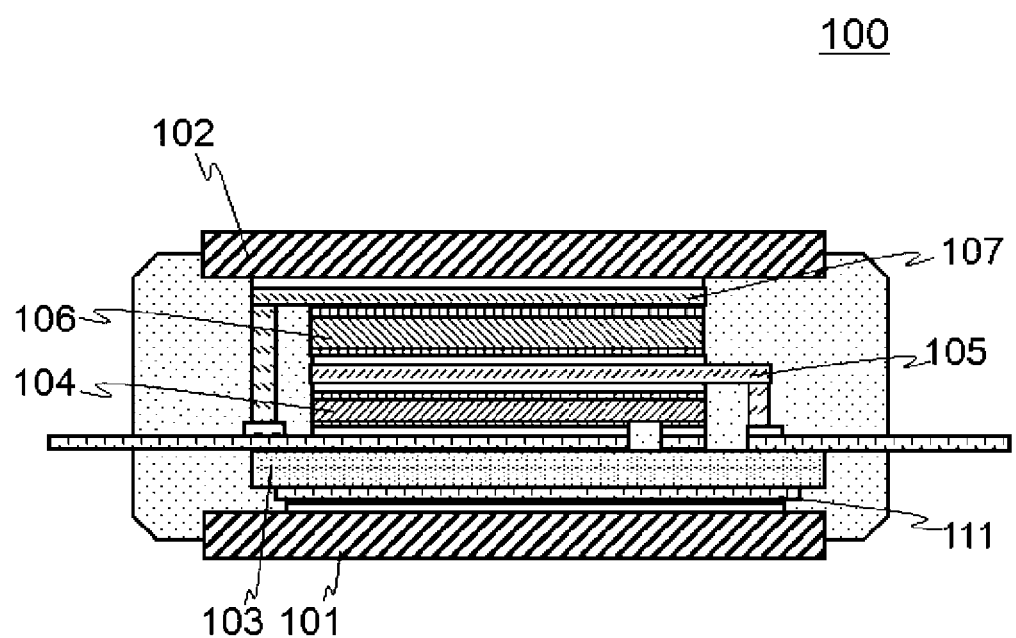
FIG. 20 is a cross-sectional view schematically illustrating a semiconductor device 100 of the related art.

In addition, according to the present embodiment, since the substrates 11 and 12 are integrated with the heat dissipation members (the wiring patterns 24 and 25), and other components are interposed between the substrates 11 and 12, the number of components can be reduced and productivity can be enhanced. In particular, in a semiconductor device 100 including a stacked structure of the related art illustrated in FIG. 20, since a heat sink 101 and a substrate 103 are separate components, and a heat sink 102 needs to be provided on an electrode 107, the number of components increases. In addition, a structure of the electrode 107 provided on a diode 14 is complicated. In contrast, in the semiconductor device 1 of the present embodiment, since it is unnecessary to separately provide a heat sink, the number of the manufacturing steps is reduced. In addition, since a structure of the electrode 16 is simple, productivity is enhanced.

In addition, in the semiconductor device 100 of the related art, since the heat sinks 101 and 102 are thick (approximately 0.5 mm thick) copper plates, and since the heat sink 101 and the substrate 103 abut on each other via a wiring pattern 111, due to a difference in a linear expansion coefficient between aluminum nitride (AlN) or silicon nitride (SIN) that is a material of the substrate 103, and copper that is a material of the heat sink 101 (see Table 1), a defect such as poor connection at an interface or a crack of a conductive material is easily generated, and the reliability of the semiconductor device may decrease. In contrast, in the semiconductor device 1 of the present embodiment, since the wiring patterns 24 and 25 provided in the substrates 11 and 12 are thin and used as heat dissipation members, the wiring patterns 24 and 25 do not peel from the substrates 11 and 12 due to a difference in a linear expansion coefficient, and reliability does not decrease.

In addition, according to the present embodiment, since the wiring patterns 24 and 25 used as the heat dissipation members are not covered with the sealing resin 19 and are exposed to the outside, heat can be dissipated reliably via the wiring patterns 24 and 25.

In addition, according to the present embodiment, the electrode 15 is formed by using molybdenum, tungsten, or 42 alloy, and thus an amount of deformation of the switching element 13 and the diode 14 due to heat becomes substantially the same as an amount of deformation of the electrode 15 due to heat, and strain due to heat inside the semiconductor device 1 at high temperature is reduced. As a result, the heat resistance of the semiconductor device 1 can be enhanced. Since the heat resistance of the semiconductor device 1 is high, a large cooling device for cooling the semiconductor device 1 becomes unnecessary and a load required for cooling can be reduced.

Figure 4:
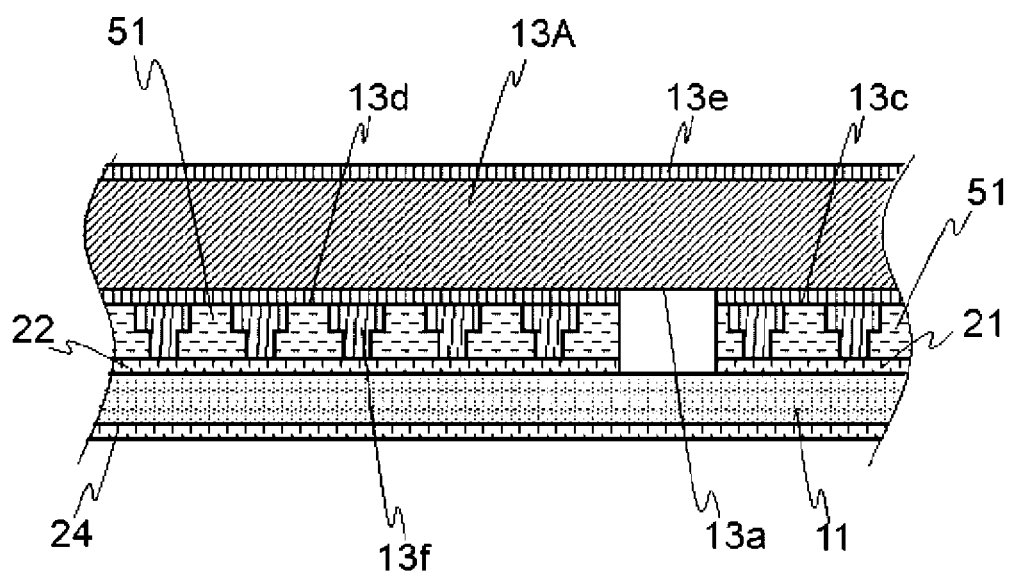
FIG. 4 is a cross-sectional and partially enlarged view of a semiconductor device 1A.
Figure 4:
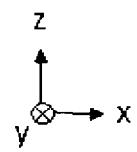

Note that in the present embodiment, the gate terminal 13c and the source terminal 13d are flat plate-shaped. However, the shapes of the gate terminal 13c and the source terminal 13d are not limited to this. FIG. 4 is a cross-sectional and partially enlarged view of a semiconductor device 1A including a switching element 13A including protrusions (hereinafter referred to as bumps 13f) formed in a gate terminal 13c and a source terminal 13d. In FIG. 4, components other than a substrate 11 and the switching element 13A are not illustrated.

A plurality of the bumps 13f are formed in each of the gate terminal 13c and the source terminal 13d. The bumps 13f may be formed of aluminum as with the gate terminal 13c and the source terminal 13d, or may be formed by using gold or copper. Each of the bumps 13f has a substantially cylindrical shape in a plan view, and includes a center portion that is formed to be higher than other portions. Tip of the bumps 13f, here tips of the center portions higher than other portions abut on wiring patterns 21 and 22.

When the switching element 13A is mounted on the wiring patterns 21 and 22 to which a conductive material 51 is applied, the bumps 13f push the conductive material apart, and the tips of the bumps 13f abut on the wiring patterns 21 and 22. The wiring pattern 21 and the gate terminal 13c are joined by the conductive material 51, and the wiring pattern 22 and the source terminal 13d are also joined by the conductive material 51.

Since the bumps 13f are provided in the gate terminal 13c and the source terminal 13d, the gate terminal 13c and the source terminal 13d are prevented from being damaged due to a load applied on the gate terminal 13c and the source terminal 13d during manufacturing of the semiconductor device 1A. In a case where the bumps 13f are not provided in the gate terminal 13c and the source terminal 13d, the switching element 13A may be inclined with respect to the substrate 11, and for example, a portion of the gate terminal 13c may be pressed strongly against the substrate 11, and the gate terminal 13c may be destroyed. In contrast, the bumps 13f are provided in the gate terminal 13c and the source terminal 13d, and thus the switching element 13A can be provided substantially parallel to the substrate 11, and destruction of the gate terminal 13c and the source terminal 13d can be prevented.

In addition, since the bumps 13f are provided in the gate terminal 13c and the source terminal 13d, an interval between the wiring patterns 22 and 23 and the switching element 13A is kept constant. In a case where the bumps 13f are not provided in the gate terminal 13c and the source terminal 13d, the switching element 13A may be too close to the substrate 11, and the conductive material 51 may overflow to the outside of the wiring patterns 21 and 22, and for example, conduction between the wiring pattern 21 and the wiring pattern 22 may occur. In contrast, the bumps 13f are provided in the gate terminal 13c and the source terminal 13d, and thus the conductive material 51 does not flow out to an unnecessary location, and a short circuit is prevented.

Second Embodiment

Figure 5:
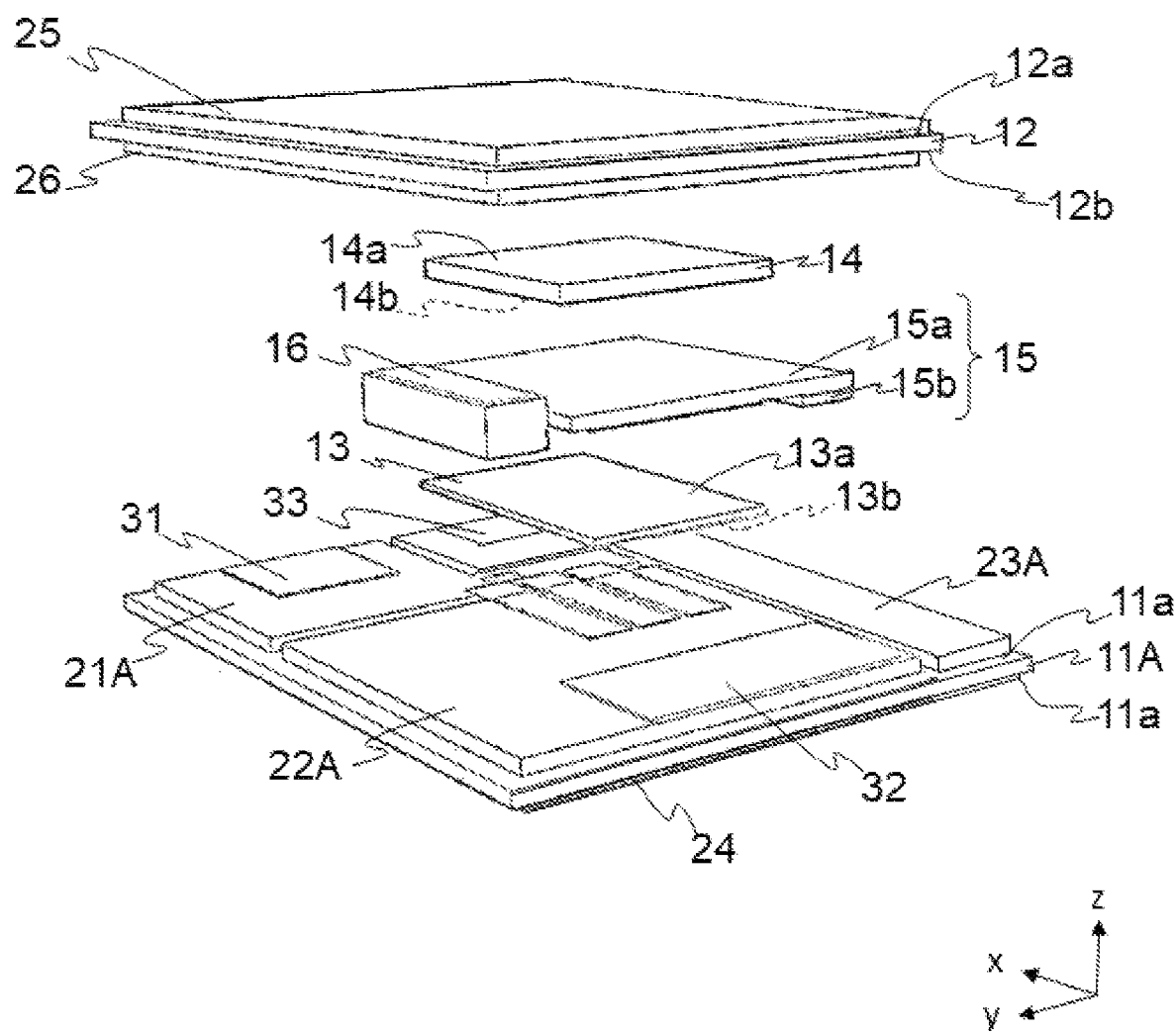
FIG. 5 is an exploded perspective view schematically illustrating a semiconductor device 2.
Figure 6:
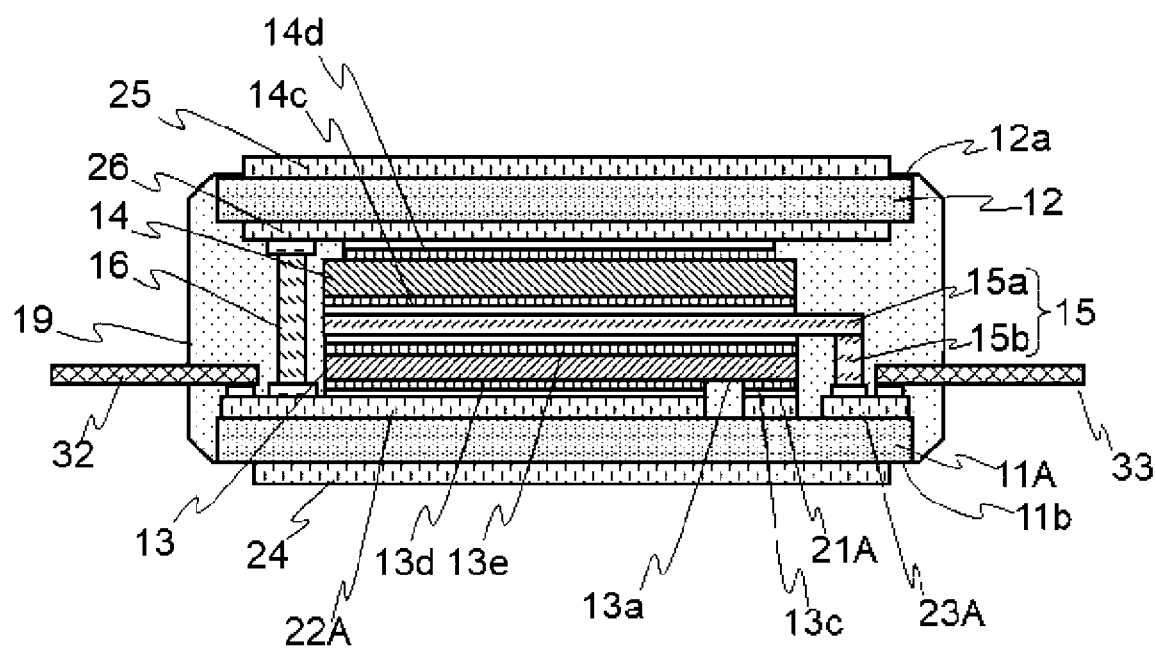
FIG. 6 is a cross-sectional view schematically illustrating the semiconductor device 2.
Figure 6:
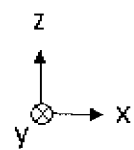

In the semiconductor device 1 according to the first embodiment, the wiring patterns 21, 22, and 23 extend to the outside of the substrate 11 and are exposed to the outside of the sealing resin 19. However, an outer lead may extend to the outside of the substrate 11. FIG. 5 is an exploded perspective view schematically illustrating a semiconductor device 2 including an outer lead. FIG. 6 is a cross-sectional view schematically illustrating the semiconductor device 2. Hereinafter, the same configurations as those of the semiconductor device 1 according to the first embodiment will be denoted by the same reference signs, and description of the same configurations will be omitted. In FIG. 5, an electrode 15 is illustrated being rotated by approximately 90 degrees for description.

The semiconductor device 2 mainly includes substrates 11A and 12, a switching element 13, a diode 14, electrodes 15 and 16, and outer leads 31, 32, and 33.

The substrate 11A is a ceramic substrate as with the substrate 11A. Wiring patterns 21A, 22A, and 23A are formed in a top surface 11a of a substrate 11. The wiring patterns 21A, 22A, and 23A differ from the wiring patterns 21, 22, and 23 in that the wiring patterns 21A, 22A, and 23A do not extend to the outside of the substrate 11.

The outer leads 31, 32, and 33 are provided in the wiring patterns 21A, 22A, and 23A, respectively. The outer leads 31, 32, and 33 are thin plates of metal such as copper and copper alloy, and are connected to an external control circuit board (not illustrated) or the like. The outer leads 31, 32, and 33 extend to the outside of the substrate 11A, and the outer leads 31, 32, and 33 are partially exposed to the outside of a sealing resin 19. Note that in FIG. 5, portions of the outer leads 31, 32, and 33 that protrude to the outside of the substrate 11A are not illustrated.

According to the present embodiment, since the outer leads 31, 32, and 33 are provided in addition to the wiring patterns 21A, 22A, and 23A, the size and the shape of each of the outer leads 31, 32, and 33 can be changed arbitrarily.

Figure 7:
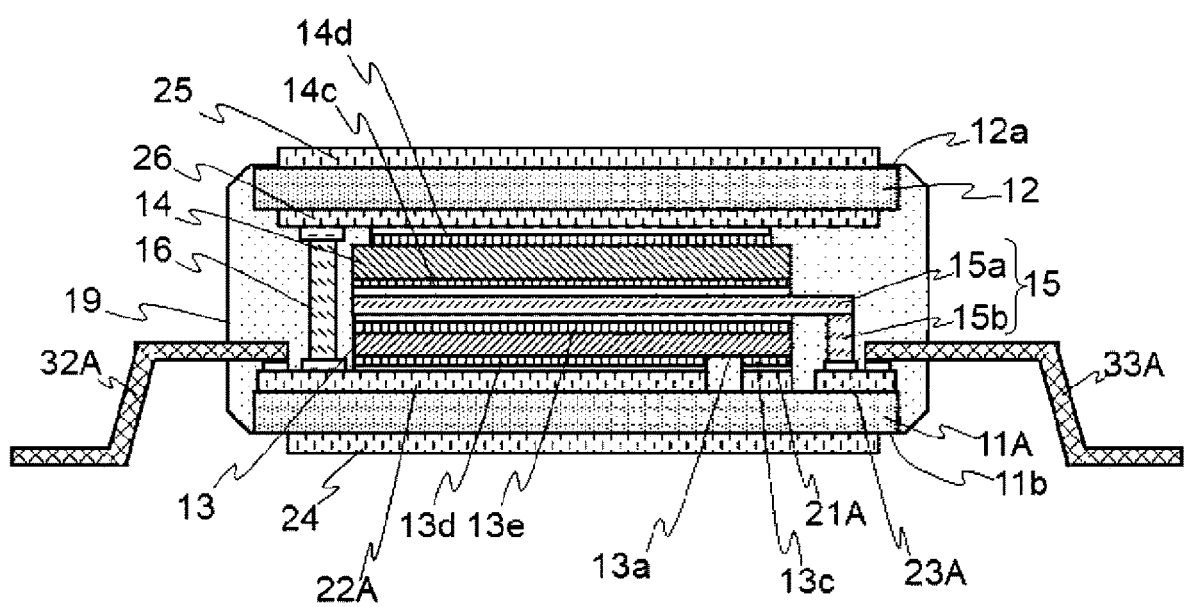
FIG. 7 is a cross-sectional view schematically illustrating a semiconductor device 2A.

FIG. 7 is a cross-sectional view schematically illustrating a semiconductor device 2A according to a modification of the second embodiment. The semiconductor device 2A mainly includes substrates 11A and 12, a switching element 13, a diode 14, electrodes 15 and 16, and outer leads 31A (not illustrated), 32A and 33A. The outer leads 31A, 32A, and 33A are so-called gull-wing type leads, and differ in a shape from the outer leads 31, 32, and 33. In the semiconductor device 2A, when the outer leads 31A, 32A, and 33A and a pattern of a control circuit board (not illustrated) are soldered, the presence or absence of a soldering defect can be confirmed visually.

Figure 8:
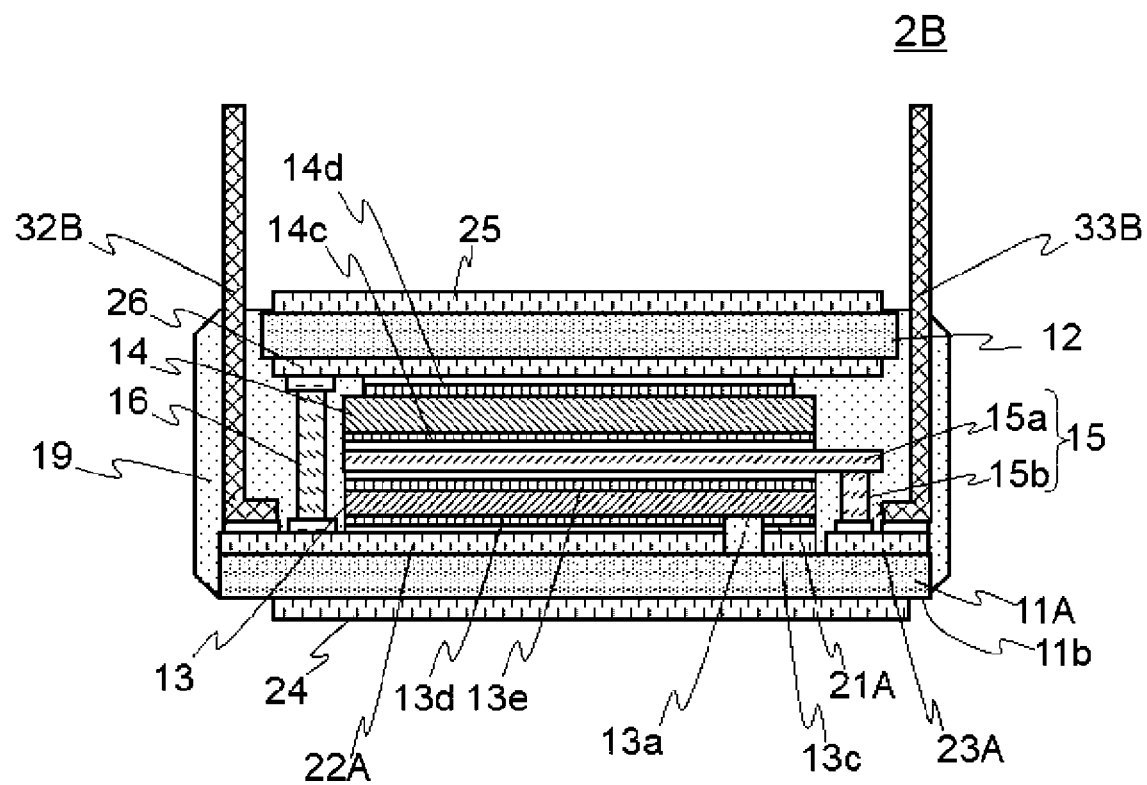
FIG. 8 is a cross-sectional view schematically illustrating a semiconductor device 2B.

FIG. 8 is a cross-sectional view schematically illustrating a semiconductor device 2B according to a modification of the second embodiment. The semiconductor device 2B mainly includes substrates 11A and 12, a switching element 13, a diode 14, electrodes 15 and 16, and outer leads 31B (not illustrated), 32B and 33B. The outer leads 31B, 32B, and 33B each have a shape of a so-called tab terminal having a portion bent at a substantially right angle, and differ in a shape from the outer leads 31, 32, and 33. In the semiconductor device 2B, the semiconductor device 2B can be mounted on a control circuit board (not illustrated) by inserting the outer leads 31B, 32B, and 33B into vias of the control circuit board.

Third Embodiment

Figure 9:
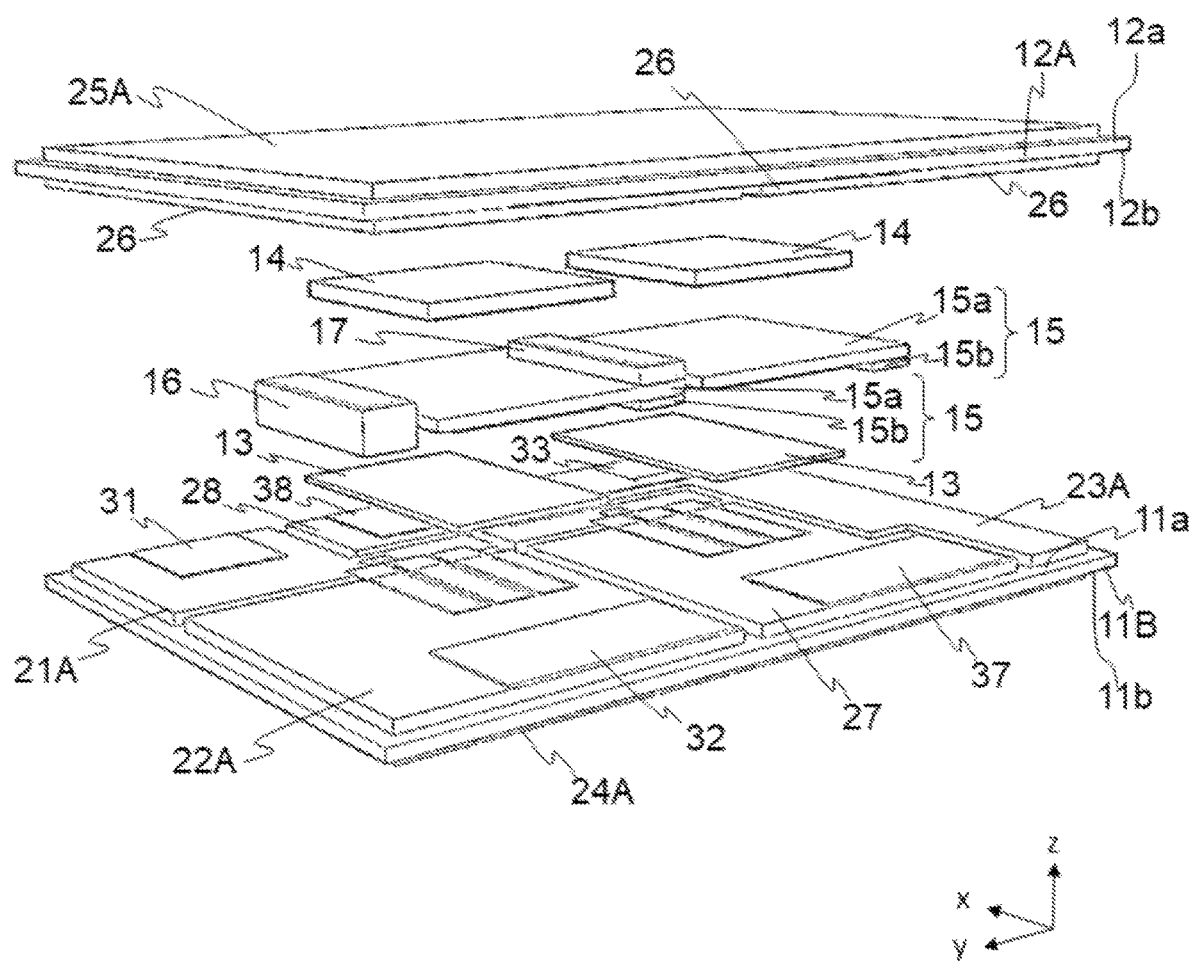
FIG. 9 is an exploded perspective view schematically illustrating a semiconductor device 3.

In the semiconductor device 2 according to the second embodiment, the semiconductor device 2 includes one unit 91 (1 in 1). However, a semiconductor device may include a plurality of units 91. FIG. 9 is an exploded perspective view schematically illustrating a semiconductor device 3 including two units 91. Hereinafter, the same configurations as those of the semiconductor device 1 according to the first embodiment or the semiconductor device 2 according to the second embodiment will be denoted by the same reference signs, and description of the same configurations will be omitted. In FIG. 9, an electrode 15 is illustrated being rotated by approximately 90 degrees for description.

The semiconductor device 3 mainly includes substrates 11B and 12A, two switching elements 13, two diodes 14, two electrodes 15, and electrodes 16 and 17.

The substrates 11B and 12A differ in a size from the substrates 11 and 12. Wiring patterns 21A, 22A, 23A, 27, and 28 are formed in a top surface 11a of the substrate 11B, and a wiring pattern 24A that is a heat dissipation member is formed in a bottom surface 11b of the substrate 11B. Gate terminals 13c (not illustrated) of the switching elements 13 are electrically connected to the wiring patterns 21A and 28, source terminals 13d (not illustrated) of the switching elements 13 are electrically connected to the wiring patterns 22A and 27, and the electrodes 15 are electrically connected to a wiring pattern 23A.

Outer leads 31, 32, 33, 37, and 38 are provided in the wiring patterns 21A, 22A, 23A, 27, and 28, respectively. Note that in FIG. 9, portions of the outer leads 31, 32, 33, 37, and 38 that protrude to the outside of the substrate 11B are not illustrated.

A wiring pattern 25A that is a heat dissipation member is formed in a top surface 12a of the substrate 12A, and two wiring patterns 26 are formed adjacent to each other in a bottom surface 12b of the substrate 12. An anode 14d (not illustrated) is electrically connected to each of the two wiring patterns 26.

In one of the two electrodes 15 (the electrode 15 in the left side (+y side) in FIG. 9), the electrode 17 being substantially columnar (here, a substantially prism shape of a substantially rectangular shape in a plan view) is provided in an upper side of a plate-like portion 15a. In a plan view (viewed from the +z direction), a position of the electrode 17 overlaps a position of a linking section 15b. The plate-like portion 15a, the linking section 15b, and the electrode 17 are provided between the substrate 11B and the substrate 12A, and electrically connect the wiring pattern 27 and the wiring patterns 26. The electrode 17 is provided in an opposite side to the linking section 15b of the electrode 15 in the −y side with the switching element 13 in the right side (−y side) in FIG. 9 interposed.

Figure 10:
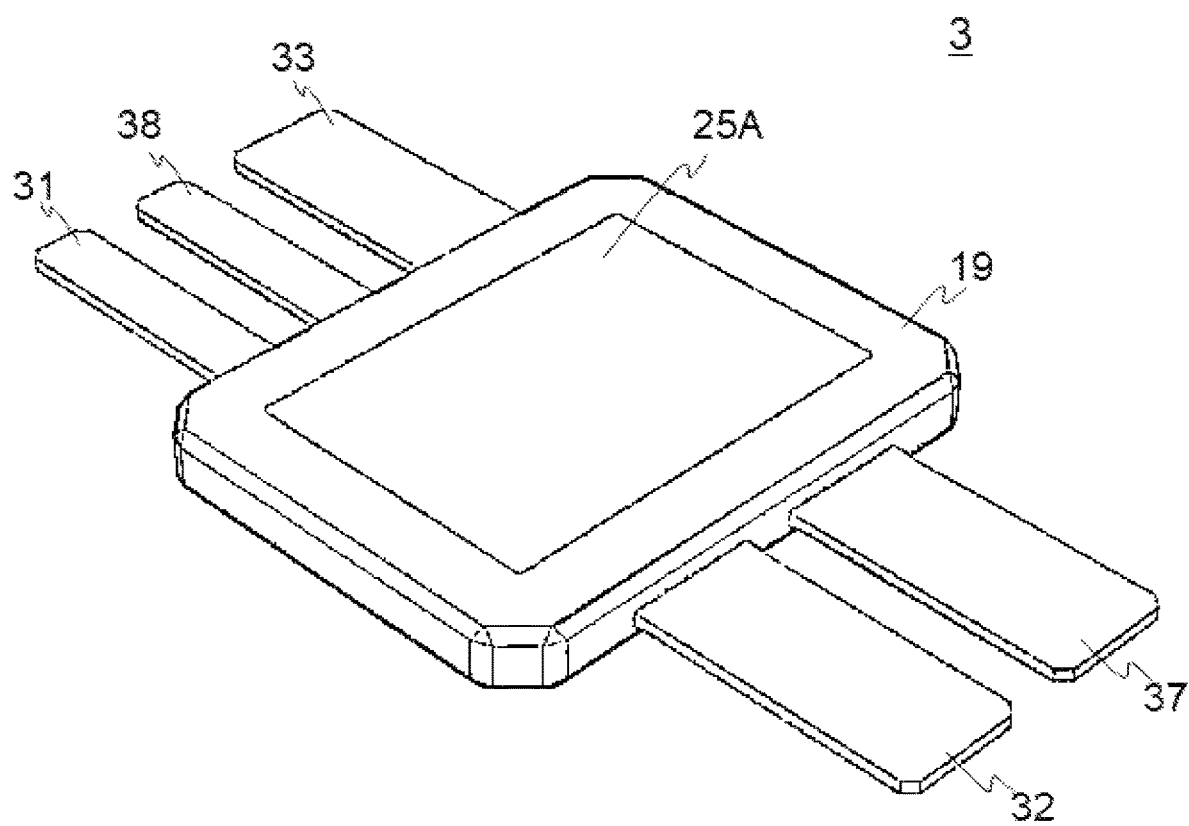
FIG. 10 is a perspective view illustrating appearance of the semiconductor device 3.

FIG. 10 is a perspective view illustrating appearance of the semiconductor device 3. The wiring pattern 24A (not illustrated) and the wiring pattern 25A are not covered with a sealing resin 19 and are exposed to the outside. In addition, the outer leads 31, 32, 33, 37, and 38 are exposed to the outside of the sealing resin 19.

Note that in the present embodiment, the semiconductor device 3 includes the two units 91 (2 in 1). However, a semiconductor device may include four units 91 (4 in 1), or may include six units 91 (6 in 1).

Fourth Embodiment

Figure 11:
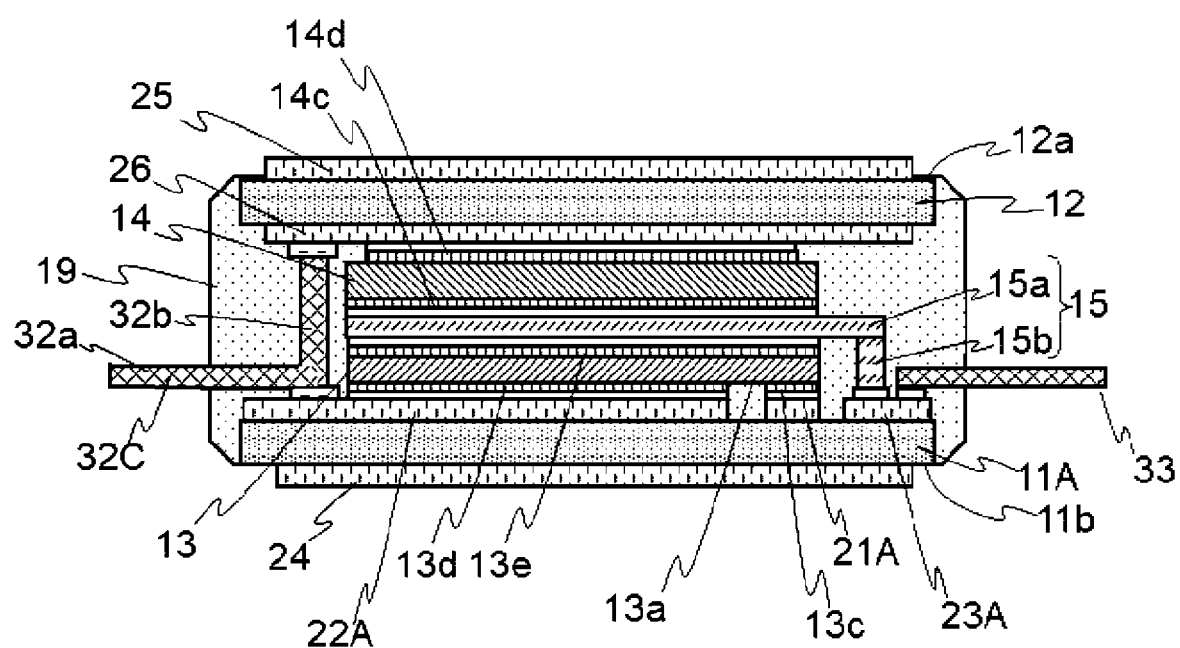
FIG. 11 is a cross-sectional view schematically illustrating a semiconductor device 4.
Figure 11:
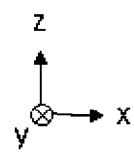

In the semiconductor device 2 according to the second embodiment, the electrode 16 is provided between the substrate 11A and the substrate 12. However, a form of the electrode provided between the substrate 11A and the substrate 12 is not limited to this. FIG. 11 is a cross-sectional view schematically illustrating a semiconductor device 4. Hereinafter, the same configurations as those of the semiconductor device 2 according to the second embodiment will be denoted by the same reference signs, and description of the same configurations will be omitted.

The semiconductor device 4 mainly includes substrates 11A and 12, a switching element 13, a diode 14, an electrode 15, and outer leads 31 (not illustrated), 32C and 33.

The outer lead 32C includes a lead portion 32a being thin plate-like, and an electrode portion 32b having a convex shape and formed in the lead portion 32a. The electrode portion 32b is formed being substantially columnar, and is provided between a substrate 11A and the substrate 12. The electrode portion 32b electrically connects a wiring pattern 22A and a wiring pattern 26.

According to the present embodiment, since the electrode that electrically connects the wiring pattern 22A and the wiring pattern 26 is integrated with the outer lead 32C, the number of components can further be reduced.

Fifth Embodiment

Figure 12:
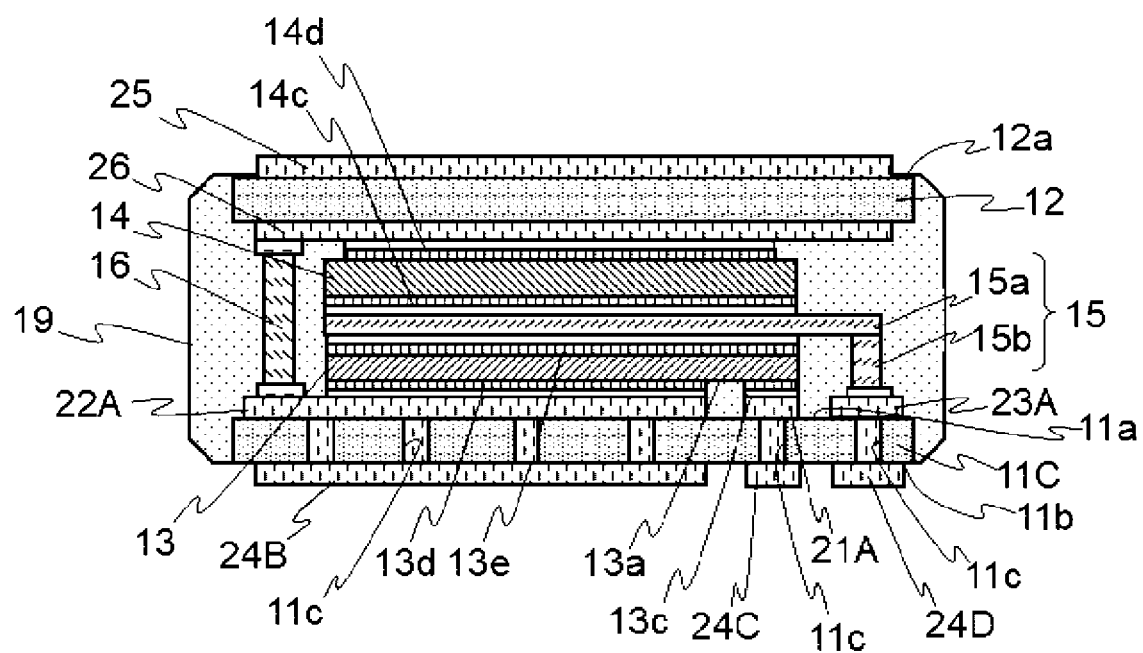
FIG. 12 is a cross-sectional view schematically illustrating a semiconductor device 5.

In the semiconductor device 1 according to the first embodiment, the wiring patterns 21, 22, and 23 extend to the outside of the substrate 11 and connect the semiconductor device 1 and an external control circuit board or the like via the wiring patterns 21, 22, and 23. However, a connection form of the semiconductor device 1 and the external control circuit board or the like is not limited to this. FIG. 12 is a cross-sectional view schematically illustrating a semiconductor device 5. Hereinafter, the same configurations as those of the semiconductor device 2 according to the second embodiment will be denoted by the same reference signs, and description of the same configurations will be omitted.

The semiconductor device 5 mainly includes substrates 11C and 12, a switching element 13, a diode 14, and electrodes 15 and 16.

The substrate 11C is a ceramic substrate as with the substrate 11. Wiring patterns 21A, 22A, and 23A are formed in a top surface 11a of the substrate 11C. Wiring patterns 24B, 24C, and 24D are formed in a bottom surface 11b of the substrate 11C.

A plurality of vias 11c are formed in the substrate 11C. The vias 11c vertically penetrate the inside of the substrate 11C and electrically connect the wiring patterns formed in the top surface 11a and the wiring patterns formed in the bottom surface 11b. The vias 11c electrically connect the wiring pattern 21A and the wiring pattern 24C, electrically connect the wiring pattern 22A and the wiring pattern 24B, and electrically connect the wiring pattern 23A and the wiring pattern 24D. Accordingly, a gate terminal 13c and the wiring pattern 24C are electrically connected, a source terminal 13d and the wiring pattern 24B are electrically connected, and a drain terminal 13e and the wiring pattern 24D are electrically connected. That is, the wiring patterns 24B, 24C, and 24D are heat dissipation members, and are also wiring patterns that performs electrical connection.

According to the present embodiment, the substrate 11C can be placed in a control circuit board (not illustrated), and can directly connect the wiring patterns 24B, 24C, and 24D formed in the bottom surface 11b of the substrate 11C to a pattern on the control circuit board (not illustrated). In addition, since the wiring patterns and outer leads do not protrude in the horizontal direction, further miniaturization can be archived. In addition, when the semiconductor device 5 is mounted on another device, a degree of freedom of placement of the semiconductor device 5 increases, and a degree of freedom of the device on which the semiconductor device 5 is mounted is enhanced. The present embodiment is effective in a form in which a current flowing through the source terminal 13d and the drain terminal 13e is relatively small (for example, about 150 A).

Figure 13:
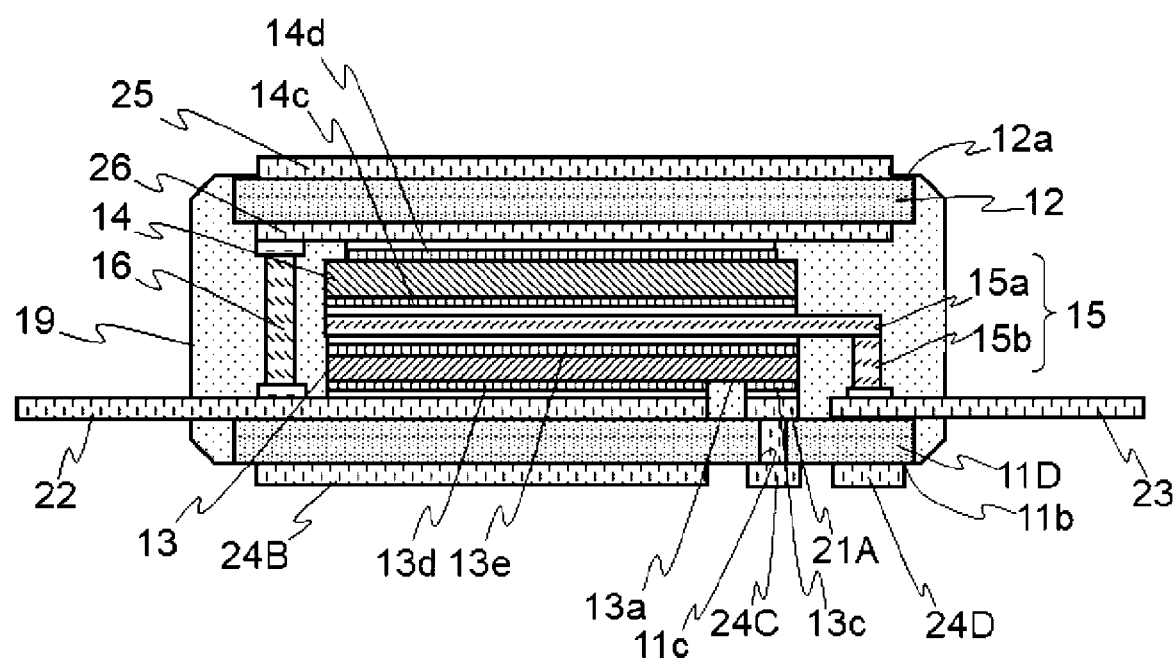
FIG. 13 is a cross-sectional view schematically illustrating a semiconductor device 5A.

FIG. 13 is a cross-sectional view schematically illustrating a semiconductor device 5A according to a modification of the fifth embodiment.

The semiconductor device 5A mainly includes substrates 11D and 12, a switching element 13, a diode 14, and electrodes 15 and 16. A substrate 11D is a ceramic substrate as with the substrate 11. Wiring patterns 21A, 22, and 23 are formed in a top surface 11a of the substrate 11D. A via 11c formed in the substrate 11D electrically connects the wiring pattern 21A and a wiring pattern 24C.

A gate terminal 13c through which a large current does not flow is connected to a control circuit board (not illustrated) via the wiring pattern 24C formed in a bottom surface 11b of a substrate 11D, and a source terminal 13d and a drain terminal 13e through which a large current flows are connected to the control circuit board (not illustrated) via the wiring patterns 22 and 23, respectively. Accordingly, a large current can be made flow while miniaturizing the semiconductor device 5A.

Sixth Embodiment

Figure 14:
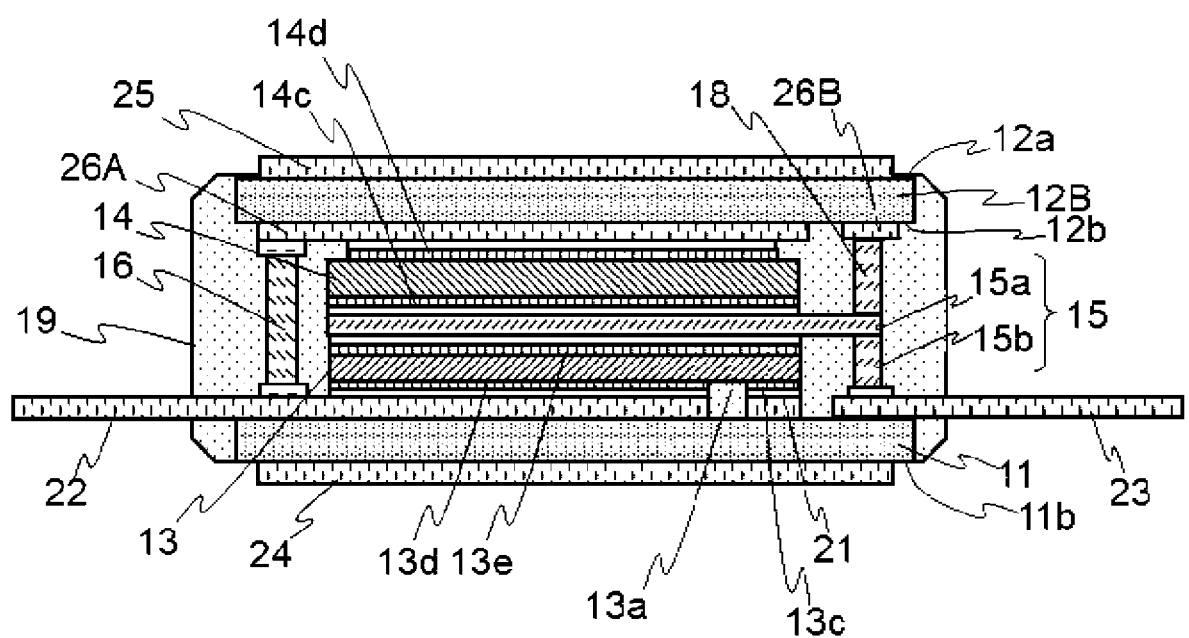
FIG. 14 is a cross-sectional view schematically illustrating a semiconductor device 6.
Figure 14:
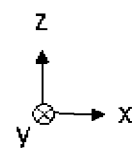

In the semiconductor device 1 according to the first embodiment, the electrode 15 transfers heat generated by the switching element 13 or the diode 14. However, a form of transferring heat generated by the switching element 13 or the diode 14 is not limited to this. FIG. 14 is a cross-sectional view schematically illustrating a semiconductor device 6. Hereinafter, the same configurations as those of the semiconductor device 1 according to the first embodiment will be denoted by the same reference sings, and description of the same configurations will be omitted.

The semiconductor device 6 mainly includes substrates 11 and 12B, a switching element 13, a diode 14, and electrodes 15, 16 and 18. The substrate 12B is a ceramic substrate as with the substrate 12B. Wiring patterns 26A and 26B are formed in a bottom surface 12b of a substrate 12. The wiring pattern 26B is not electrically connected to the wiring pattern 26A.

The electrode 18 being substantially columnar (here, a substantially prism shape of a substantially rectangular shape in a plan view) is provided between a plate-like portion 15a and the substrate 12B. The electrode 18 electrically connects the electrode 15 and the wiring pattern 26B. In a plan view, the plate-like portion 15a is larger than the diode 14, and the electrode 18 and a linking section 15b overlap each other.

According to the present embodiment, since heat generated by the switching element 13 or the diode 14 is transferred to both the substrates 11 and 12B, heat can be dissipated more efficiently via wiring patterns 24 and 25.

Seventh Embodiment

Figure 15:
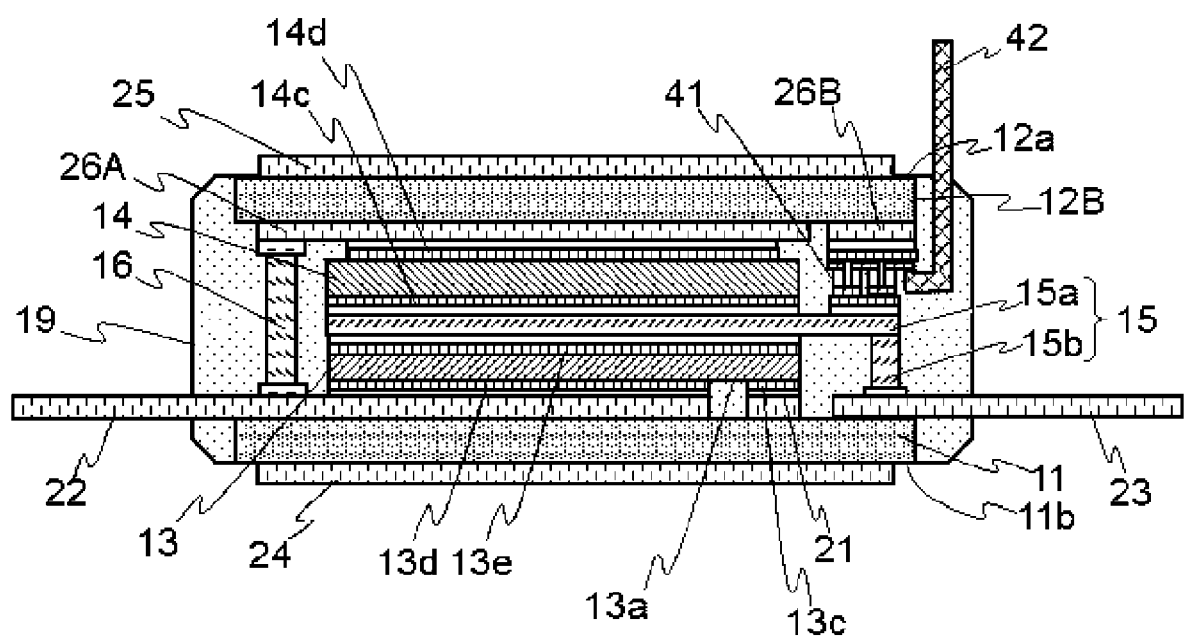
FIG. 15 is a cross-sectional view schematically illustrating a semiconductor device 7.
Figure 15:
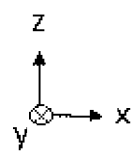

In the semiconductor device 6 according to the sixth embodiment, the electrodes 15 and 18 transfer heat generated by the switching element 13 or the diode 14 to the substrates 11 and 12B, and thus heat is dissipated more effectively. However, a form of performing more effective heat dissipation is not limited to this. FIG. 15 is a cross-sectional view schematically illustrating a semiconductor device 7. Hereinafter, the same configurations as those of the semiconductor device 6 according to the sixth embodiment will be denoted by the same reference sings, and description of the same configurations will be omitted.

The semiconductor device 7 mainly includes substrates 11 and 12B, a switching element 13, a diode 14, electrodes 15 and 16, a Peltier element 41, and an outer lead 42.

A plate-like portion 15a is larger than the diode 14 in a plan view. The Peltier element 41 is provided between the plate-like portion 15a and the substrate 12B. The outer lead 42 is provided in the Peltier element 41, and the Peltier element 41 and a power source (not illustrated) or the like are connected via the outer lead 42.

According to the present embodiment, since heat generated by the switching element 13 or the diode 14 is transferred to the substrate 11 and forcibly dissipated by using the Peltier element 41, heat can be dissipated more efficiently.

Eighth Embodiment

Figure 16:
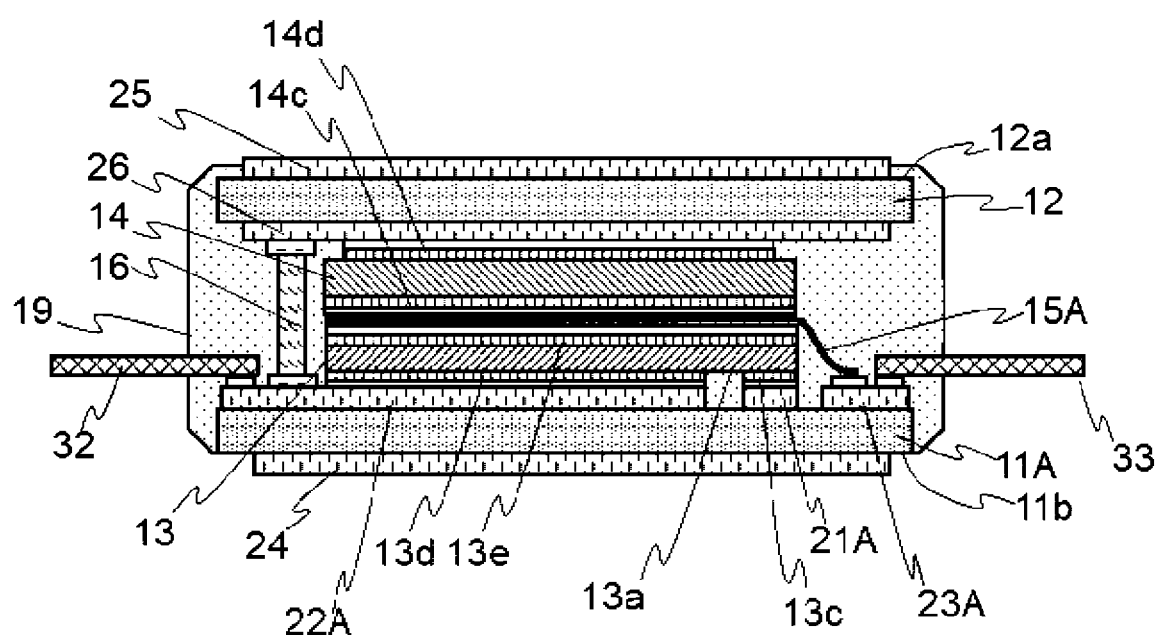
FIG. 16 is a cross-sectional view schematically illustrating a semiconductor device 8.
Figure 16:
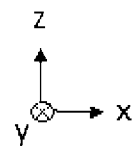

In the semiconductor device 1 according to the first embodiment and the semiconductor device 2 according to the second embodiment, the electrode 15 connects the switching element 13 and the diode 14 to the substrate 11. However, a form of connecting the switching element 13 and the diode 14 to the substrate is not limited to this. FIG. 16 is a cross-sectional view schematically illustrating a semiconductor device 8. Hereinafter, the same configurations as those of the semiconductor device 2 according to the second embodiment will be denoted by the same reference signs, and description of the same configurations will be omitted.

The semiconductor device 8 mainly includes substrates 11A and 12, a switching element 13, a diode 14, electrodes 15A and 16, and outer leads 31 (not illustrated), 32 and 33. The electrode 15A is ribbon wire being flexible and wide. A portion of the electrode 15A interposed between the switching element 13 and the diode 14 corresponds to a plate-like portion, and a portion protruding from the switching element 13 and the diode 14 corresponds to a linking section.

The thickness of the electrode 15A is smaller than a thickness T (for example, approximately 300 μm to approximately 500 μm) of each of wiring patterns 21A, 22A, 23A, 24, 25, and 26 and the outer leads 31, 32, and 33, and is approximately half the thickness T, for example. However, the thickness of the electrode 15A may be approximately not less than half the thickness T and not greater than the thickness T, and is changed according to a magnitude of a current flowing through the semiconductor device 8.

As a material of the electrode 15A, aluminum (Al), copper (Cu), molybdenum, tungsten, 42 alloy or the like can be used. Since the thickness of the electrode 15A is reduced to be approximately half the thickness of each of the wiring patterns 21A, 22A, 23A, 24, 25, and 26 and the outer leads 31, 32, and 33 and generated stress reduces, aluminum (Al) or copper (Cu) can be used for the electrode 15A. However, to reduce strain due to thermal deformation, it is desirable to form the electrode 15A by using molybdenum, tungsten, 42 alloy or the like.

According to the present embodiment, since the electrode 15A is ribbon wire, a general material can be used for the electrode 15A. In addition, since the electrode 15A is ribbon wire, the electrode 15A is easily bent, and the semiconductor device 8 is easily manufactured.

Ninth Embodiment

In the semiconductor device 1 according to the first embodiment, the switching element 13 and the diode 14 are stacked. However, two electronic components to be stacked are not limited to the switching element 13 and the diode 14. Hereinafter, the same configurations as those of the semiconductor device 1 according to the first embodiment will be denoted by the same reference signs, and description of the same configurations will be omitted.

Figure 17:
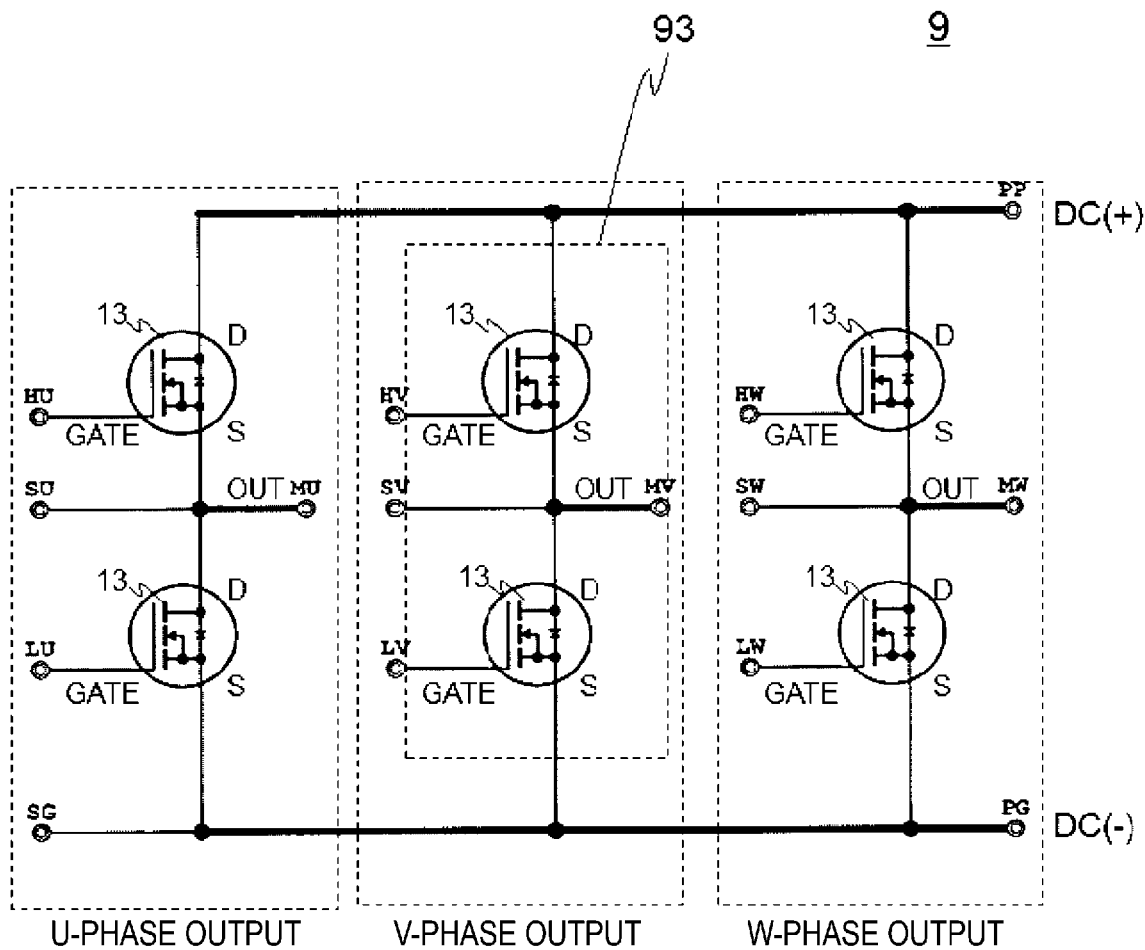
FIG. 17 is a circuit diagram illustrating an example of a circuit configuration of a semiconductor device 9.

FIG. 17 is a circuit diagram illustrating an example of a circuit configuration of the semiconductor device 9. The circuit is a power conversion circuit including a three-phase pulse width modulation (PWM) inverter, and includes a U-phase output, a V-phase output, and a W-phase output between high-voltage direct current power source lines DC (+) and DC (−).

The U-phase output, the V-phase output, and the W-phase output each include the two switching elements 13. The two switching elements are referred to as a unit 93. A drain (D) of one of the switching elements 13 and a source (S) of the other of the switching elements 13 are connected to each other. A gate (GATE) of each of the switching elements 13 is controlled by a control circuit (not illustrated). Output lines (OUT) of the U-phase output, the V-phase output, and the W-phase output are connected to a U-phase coil, a V-phase coil, and a W-phase coil of a three-phase motor, respectively.

Figure 18:
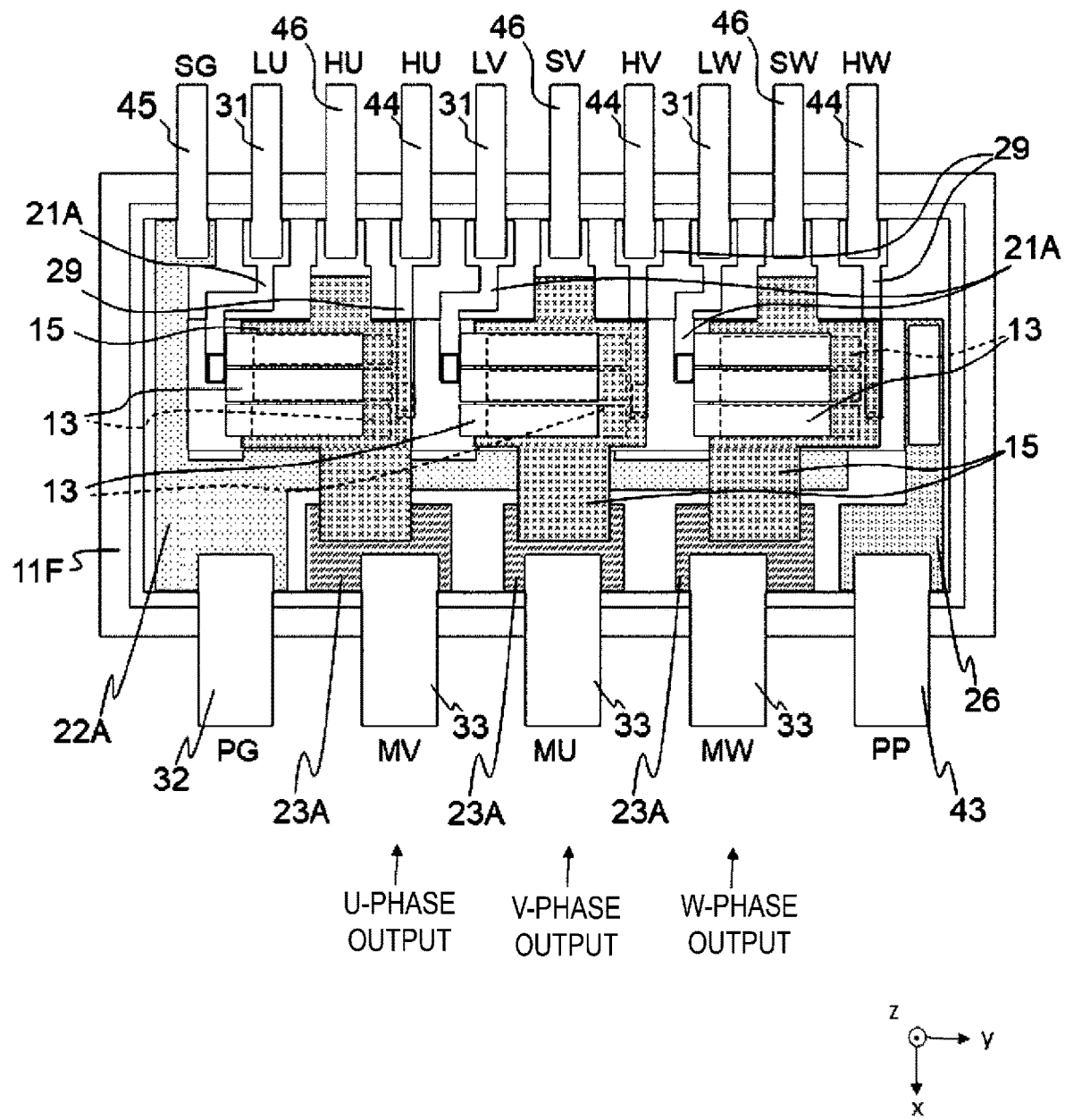
FIG. 18 is a plan view schematically illustrating the semiconductor device 9.
Figure 19:
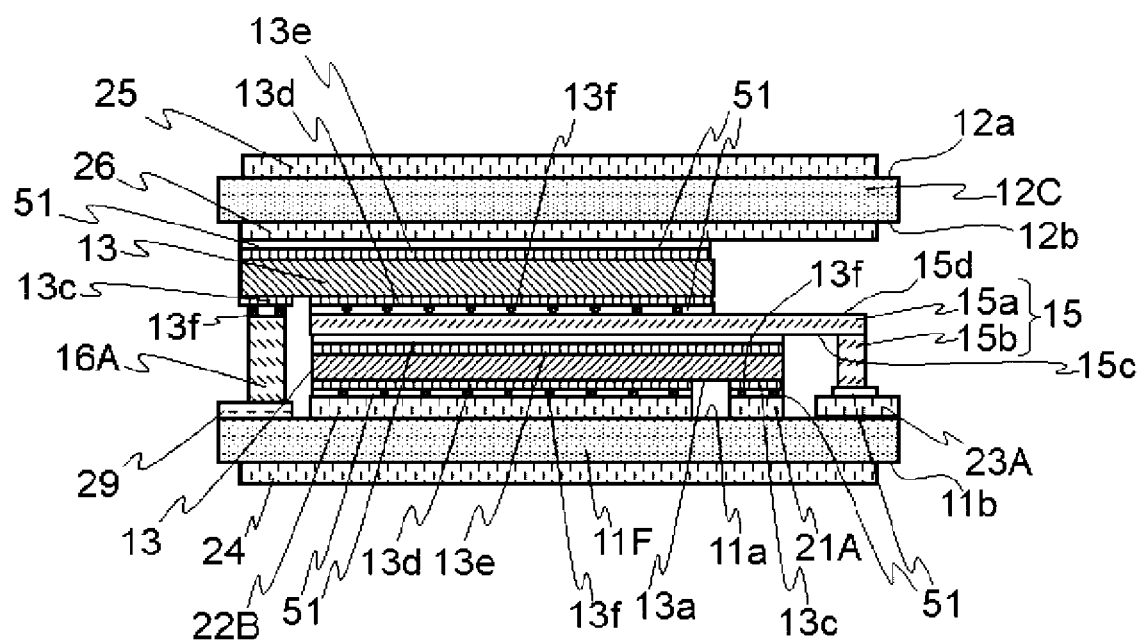
FIG. 19 is a cross-sectional view schematically illustrating the semiconductor device 9.

FIG. 18 is a plan view schematically illustrating the semiconductor device 9. FIG. 19 is a cross-sectional view schematically illustrating the semiconductor device 9. The semiconductor device 9 mainly includes substrates 11F and 12C, the switching elements 13, electrodes 15 and 16A, and outer leads 31, 32, 33, 43, 44, 45, and 46. Note that in FIGS. 18 and 19, a sealing resin 19 is not illustrated, and in FIG. 18, most of portions of the substrate 12C are not illustrated. In addition, a symbol of two alphabetical characters described adjacent to each of the outer leads 31, 32, 33, 43, 44, 45, and 46 in FIG. 18 corresponds to a symbol of two alphabetical characters described in FIG. 17.

Wiring patterns 21A, 22B, 23A, and 29 are formed in a top surface 11a of the substrate 11F, and a wiring pattern 24 is formed in a bottom surface 11b of a substrate 11. A gate terminal 13c of each of the switching elements 13 is electrically connected to the wiring pattern 21A, a source terminal 13d of each of the switching elements 13 is electrically connected to the wiring pattern 22B, and the electrode 15 (linking section 15b) is electrically connected to the wiring pattern 23A. For description, wiring patterns 22A, 23A, and 26 are shaded in FIG. 18. In addition, in FIG. 18, only a portion of the wiring pattern 26 is illustrated.

The outer lead 31 is connected to the wiring pattern 21A, the outer leads 32 is connected to the wiring pattern 22A, the outer lead 33 is connected to the wiring pattern 23A, and the outer lead 44 is connected to the wiring pattern 29.

The switching element 13 is provided on the substrate 11F, and the electrode 15 is provided on the switching element 13. In addition, the switching element 13 is provided on the electrode 15. For description, in FIG. 18, the electrode 15 is shaded, and the switching element 13 under the electrode 15 is illustrated by a dotted line.

In each of the two switching elements 13, the gate terminal 13c and the source terminal 13d face to the lower side, and a drain terminal 13e faces to the upper side. The drain terminal 13e of the switching element 13 of the lower side is electrically connected to a surface 15c of a plate-like portion 15a. The source terminal 13d of the switching element 13 of the upper side is electrically connected to a surface 15d of the plate-like portion 15a.

The drain terminal 13e of the switching element 13 of the upper side is electrically connected to the wiring pattern 26 formed in a bottom surface 12b of the substrate 12C. Accordingly, the two switching elements 13 are stacked. The outer lead 43 is connected to the wiring pattern 26. For description, the wiring pattern 26 is shaded in FIG. 18. In addition, in FIG. 18, only a portion of the wiring pattern 26 is illustrated.

The electrode 16A is a substantially columnar member provided between the substrate 11F and the substrate 12C, and electrically connects the wiring pattern 29 and the gate terminal 13c of the switching element 13 of the upper side. The electrode 16A and the electrode 16 are the same except for the height.

Each terminal (the gate terminal 13c, the source terminal 13d, and the drain terminal 13e) of each of the switching elements and the wiring patterns 21, 22, 26, and 29 are joined and electrically connected by a conductive material 51 being paste and solidifying by sintering. In addition, each terminal (the source terminal 13d and the drain terminal 13e) of each of the switching elements and the plate-like portion 15a are joined and electrically connected by the conductive material 51.

A plurality of bumps 13f are formed in each of the gate terminal 13c and the source terminal 13d. Tips of the bumps 13f, here tips of center portions higher than other portions, abut on the wiring patterns 21A and 22B and the electrode 16A. Accordingly, the gate terminal 13c and the source terminal 13d are prevented from being damaged due to a load applied on the gate terminal 13c and the source terminal 13d. In addition, the switching elements 13 can be prevented from being too close to the substrate 11, and occurrence of conduction between wiring patterns that are originally not to be electrically connected to each other can be prevented.

The outer leads 31 and 44 are connected to the gate terminal 13c and correspond to LU, HU, LV, HV, LW and HW electrodes of FIG. 17. The outer lead 32 is connected to the source terminal 13d of the switching element 13 of the lower side, and corresponds to a PG electrode of FIG. 17. The outer lead 33 is connected to the drain terminal 13e of the switching element 13 of the lower side, and corresponds to an MU electrode, an MV electrode, and an MW electrode of FIG. 17. The outer lead 43 is connected to the drain terminal 13e of the switching element of the upper side, and corresponds to a PP electrode of FIG. 17.

Next, a method of manufacturing the semiconductor device 9 is substantially the same as the method of manufacturing the semiconductor device 1. As described in the manufacturing method 1, all components may be mounted in order with the substrate 11F being as a reference, or as described in the manufacturing method 2, a first assembly with the substrate 11F being as a reference and a second assembly with the substrate 12C being as a reference may be made, and subsequently the second assembly may be mounted on the first assembly.

According to the present embodiment, the gate terminal 13c is disposed downward, and thus the two switching elements 13 can overlap, and the semiconductor device 9 can be miniaturized.

Note that in the present embodiment, the plurality of bumps 13f are formed in the gate terminal 13c and the source terminal 13d. However, the bumps 13f are not essential. However, to prevent destruction or a short circuit of the gate terminal 13c and the source terminal 13d, it is desirable to provide the bumps 13f.

The embodiments of the invention are described above in detail with reference to the drawings. Specific configurations are not limited to the embodiments and also include changes in design or the like without departing from the gist of the invention. For example, in the examples described above, detailed description is made to facilitate understanding of the present invention, and the examples are not necessarily limited to examples including all the configurations described above. In addition, the configuration of an embodiment can be replaced partially with the configurations of other embodiments. In addition, addition, deletion, replacement or the like of other configurations can be made on the configurations of the embodiments.

In addition, the term "substantially" in the present invention is a concept not only including the case of being strictly the same, but also including an error and deformation to the extent that a loss of identity does not occur. For example, a "substantially rectangular shape" is not limited to the case of being a strictly rectangular shape, and is a concept that includes some errors (for example, partially including a curve). In addition, for example, in the case of simply expressing as a rectangular shape or the like, the case includes not only the case of being strictly rectangular shape or the like, but also the case of being a substantially rectangular shape or the like.

In addition, in the present invention, the term "near" means to include a region in a certain range (the range can be determined arbitrarily) near a reference position. For example, the term "near a peripheral edge" refers to a region in a certain range near a peripheral edge, and is a concept indicating that the region may or may not include a peripheral edge.

REFERENCE SIGNS LIST 1, 1A, 2, 2A, 2B, 3, 4, 5, 5A, 6, 7, 8, 9: Semiconductor device
11, 11A, 11B, 11C, 11D, 11E, 11F: Substrate
11a: Top surface
11b: Bottom surface
11c: Via
12, 12A, 12B, 12C: Substrate
12a: Top surface
12b: Bottom surface
13, 13A: Switching element
13a, 13b: Surface
13c: Gate terminal
13d: Source terminal
13e: Drain terminal
13f: Bump
14: Diode
14a, 14b: Surface
14c: Cathode
14d: Anode
15, 15A, 16, 16A, 17, 18: Electrode
15a: Plate-like (plate-shaped) portion
15b: Linking section
15c: Surface
15d: Surface
19: Sealing resin
21, 21A, 22, 22A, 23, 23A, 24, 24A, 24B, 24C, 24D, 25, 25A, 26, 26A, 26B,
27, 28, 29: Wiring pattern
31, 31A, 31B, 32, 32A, 32B, 32C, 33, 33A, 33B, 37, 38, 43, 44, 45, 46: Outer lead
32a: Lead portion
32b: Electrode portion
41: Peltier element
42: Outer lead
51: Conductive material
91: Unit
92: Shunt resistor
100: Semiconductor device
101, 102: Heat sink
103: Substrate
107: Electrode
111: Wiring pattern

The invention claimed is:

1. A semiconductor device comprising:
a first substrate being substantially plate-shaped, the first substrate including a first surface provided with a first wiring pattern, a second wiring pattern, and a third wiring pattern, and including a second surface being opposite to the first surface and provided with a fourth wiring pattern that is a heat dissipation member;
a second substrate being substantially plate-shaped, the second substrate including a third surface provided with a fifth wiring pattern, and including a fourth surface being opposite to the third surface and provided with a sixth wiring pattern that is a heat dissipation member, the third surface being provided in an upper side of the first substrate and facing the first surface;
a switching element being substantially plate-shaped and provided on the first substrate, the switching element including one surface provided with a source terminal and a gate terminal, and including another surface provided with a drain terminal, the source terminal being connected to the first wiring pattern and the gate terminal being connected to the second wiring pattern;
an electronic component being substantially plate-shaped and provided under the second substrate, the electronic component including one surface provided with a first terminal and including another surface provided with a second terminal, the first terminal being connected to the fifth wiring pattern;
a first electrode including a plate-shaped portion and provided between the switching element and the electronic component, and including a linking section connecting the plate-shaped portion and the third wiring pattern, the drain terminal being connected to a fifth surface of the plate-shaped portion, and the second terminal being connected to a sixth surface opposite to the fifth surface of the plate-shaped portion; and
a second electrode being columnar and provided between the first substrate and the second substrate and connecting the first wiring pattern and the fifth wiring pattern, the second electrode being provided in an opposite side to the linking section with the switching element interposed;
wherein a thickness of the plate-shaped portion is less than or equal to a thickness of each of the first wiring pattern, the second wiring pattern, the third wiring pattern, the fourth wiring pattern, the fifth wiring pattern, and the sixth wiring pattern.

2. The semiconductor device according to claim 1, wherein
each of the source terminal and the gate terminal is provided with a plurality of protrusions, each of the plurality of protrusions being formed such that a center portion is higher than other portions,
tips of the plurality of protrusions abut on the first wiring pattern or the second wiring pattern, and
the source terminal and the first wiring pattern, and the gate terminal and the second wiring pattern are joined by a conductive material being paste and solidifying by sintering.

3. The semiconductor device according to claim 1, wherein the plate-shaped portion is formed of molybdenum, tungsten, or 42 alloy.

4. The semiconductor device according to claim 1, wherein
the first substrate has a L shape in a side view,
the plate-shaped portion is larger than the electronic component in a plan view,
the third surface is provided with an eighth wiring pattern not electrically connected to the fifth wiring pattern, and
a third electrode being columnar and connecting the plate-shaped portion and the eighth wiring pattern is provided between the plate-shaped portion and the second substrate.

5. The semiconductor device according to claim 1, wherein
the first substrate has a L shape in a side view,
the plate-shaped portion is larger than the electronic component in a plan view, and
a Peltier element is provided between the plate-shaped portion and the second substrate.

6. The semiconductor device according to claim 1, wherein
the first electrode is ribbon wire being flexible and wide, and a thickness of the first electrode is not less than half a first thickness that is a thickness of each of the first wiring pattern, the second wiring pattern, the third wiring pattern, the fourth wiring pattern, the fifth wiring pattern, and the sixth wiring pattern, and not greater than the first thickness.

7. The semiconductor device according to claim 1, wherein
the second surface is provided with a seventh wiring pattern, and
a via connecting the second wiring pattern and the seventh wiring pattern is formed in the first substrate.

8. The semiconductor device according to claim 1, wherein
an outer lead is connected to the first wiring pattern, and
the second electrode is integrated with the outer lead.

9. The semiconductor device according to claim 1, wherein the electronic component is a diode, the first terminal is an anode, and the second terminal is a cathode.

10. The semiconductor device according to claim 1, wherein the electronic component is a switching element, the first terminal is a drain terminal, and the second terminal is a source terminal.

11. A method of manufacturing a semiconductor device, the method comprising the steps of:
placing a first substrate with a second surface facing up, the first substrate being plate-shaped, and including a first surface provided with a first wiring pattern, a second wiring pattern, and a third wiring pattern, and including the second surface being opposite to the first surface and provided with a fourth wiring pattern that is a heat dissipation member;
applying a conductive material to the first wiring pattern, the second wiring pattern and the third wiring pattern;
mounting a switching element on the first substrate such that a source terminal overlaps the first wiring pattern and a gate terminal overlaps the second wiring pattern, the switching element being plate-shaped, and including one surface provided with the source terminal and the gate terminal and including another surface provided with a drain terminal;
applying a conductive material on the drain terminal;
mounting on the switching element and the first substrate a first electrode including a plate-shaped portion and a linking section such that the plate-shaped portion overlaps the drain terminal and the linking section overlaps the third wiring pattern;
mounting a second electrode being columnar on the first substrate such that the second electrode overlaps the first wiring pattern, and forming a first assembly;
placing a second substrate with a third surface facing up, the second substrate being plate-shaped, and including the third surface provided with a fifth wiring pattern and including a fourth surface being opposite to the third surface and provided with a sixth wiring pattern that is a heat dissipation member;
applying a conductive material to the fifth wiring pattern;
mounting an electronic component on the second substrate such that a first terminal overlaps the fifth wiring pattern, and forming a second assembly, the electronic component being plate-shaped, and including one surface provided with the first terminal and including another surface provided with a second terminal;
applying a conductive material to the plate-shaped portion of the first assembly; and
mounting the second assembly on the first assembly such that the second terminal overlaps the plate-shaped portion and the fifth wiring pattern overlaps the second electrode.

12. The semiconductor device according to claim 2, wherein the plate shaped portion is formed of molybdenum, tungsten, or 42 alloy.

13. The semiconductor device according to claim 2, wherein
the first substrate has a L shape in a side view,
the plate shaped portion is larger than the electronic component in a plan view,
the third surface is provided with an eighth wiring pattern not electrically connected to the fifth wiring pattern, and
a third electrode being columnar and connecting the plate shaped portion and the eighth wiring pattern is provided between the plate shaped portion and the second substrate.

14. The semiconductor device according to claim 3, wherein
the first substrate has a L shape in a side view,
the plate shaped portion is larger than the electronic component in a plan view,
the third surface is provided with an eighth wiring pattern not electrically connected to the fifth wiring pattern, and
a third electrode being columnar and connecting the plate shaped portion and the eighth wiring pattern is provided between the plate shaped portion and the second substrate.

15. The semiconductor device according to claim 2, wherein
the first substrate has a L shape in a side view,
the plate shaped portion is larger than the electronic component in a plan view, and
a Peltier element is provided between the plate shaped portion and the second substrate.

16. The semiconductor device according to claim 3, wherein
the first substrate has a L shape in a side view,
the plate shaped portion is larger than the electronic component in a plan view, and
a Peltier element is provided between the plate shaped portion and the second substrate.

17. The semiconductor device according to claim 2, wherein
the first electrode is ribbon wire being flexible and wide, and
a thickness of the first electrode is not less than half a first thickness that is a thickness of each of the first wiring pattern, the second wiring pattern, the third wiring pattern, the fourth wiring pattern, the fifth wiring pattern, and the sixth wiring pattern, and not greater than the first thickness.

18. The semiconductor device according to claim 2, wherein
the second surface is provided with a seventh wiring pattern, and
a via connecting the second wiring pattern and the seventh wiring pattern is formed in the first substrate.

19. The semiconductor device according to claim 3, wherein
the second surface is provided with a seventh wiring pattern, and
a via connecting the second wiring pattern and the seventh wiring pattern is formed in the first substrate.

20. The semiconductor device according to claim 4, wherein
   the second surface is provided with a seventh wiring pattern, and
   a via connecting the second wiring pattern and the seventh wiring pattern is formed in the first substrate.

* * * * *